(12) United States Patent  
Itakura et al.

(10) Patent No.: US 6,396,249 B1
(45) Date of Patent: May 28, 2002

(54) LOAD ACTUATION CIRCUIT

(75) Inventors: Hirokazu Itakura, Aichi-ken; Junichi Nagata, Okazaki, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/671,141

(22) Filed: Sep. 28, 2000

(30) Foreign Application Priority Data

Sep. 30, 1999 (JP) .......................................... 11-279302
Jul. 6, 2000 (JP) ...................................... 2000-205286

(51) Int. Cl.⁷ ................................................ G05P 1/56
(52) U.S. Cl. ...................................... 323/273; 327/538
(58) Field of Search ............................... 323/273, 274, 323/280; 327/538, 540

(56) References Cited

U.S. PATENT DOCUMENTS

| | | |
|---|---|---|
| 4,435,678 A | 3/1984 | Joseph et al. |
| 4,553,084 A | 11/1985 | Wrathall |
| 4,562,550 A * | 12/1985 | Beatty et al. ............... 364/492 |
| 4,567,537 A | 1/1986 | Kalkhof et al. |
| 4,618,816 A | 10/1986 | Monticelli |
| 4,739,246 A | 4/1988 | Thomson |
| 4,792,750 A | 12/1988 | Yan |
| 4,810,902 A | 3/1989 | Storti et al. |
| 4,820,968 A | 4/1989 | Wrathall |
| 4,893,148 A | 1/1990 | Mihara et al. |
| 4,893,158 A | 1/1990 | Mihara et al. |
| 5,081,379 A | 1/1992 | Korteling |
| 5,177,659 A | 1/1993 | Zisa et al. |
| 5,220,207 A | 6/1993 | Kovalcik et al. |
| 5,473,276 A | 12/1995 | Throngnumchai |
| 5,481,179 A | 1/1996 | Keeth |
| 5,504,448 A | 4/1996 | Bennett et al. |
| 5,656,968 A | 8/1997 | Sander et al. |
| 5,689,176 A * | 11/1997 | Deloy ........................ 323/222 |
| 5,838,526 A * | 11/1998 | Ishikawa et al. ............ 361/118 |
| 5,939,921 A | 8/1999 | Strauss et al. |
| 5,999,041 A | 12/1999 | Nagata et al. |

FOREIGN PATENT DOCUMENTS

| | | |
|---|---|---|
| EP | 0107028 | 5/1984 |
| EP | 0402928 | 12/1990 |

(List continued on next page.)

OTHER PUBLICATIONS

D.M. Taub, "Current–Threshold Circuit", *IBM Technical Disclosure Bulletin*, vol. 17, No. 3, Aug. 1974, p. 750.

*Primary Examiner*—Adolf Deneke Berhane
(74) *Attorney, Agent, or Firm*—Law Offices of David G. Posz

(57) ABSTRACT

A load actuation circuit is provided which is capable of placing a limit on load current to a load below a predetermined value with high accuracy. In the load actuation circuit, a series circuit comprising a detection transistor and an NPN transistor is connected in parallel with an output transistor for supplying a load current to the load, and a diode is placed between the gates of the output transistor and the detection transistor for producing a voltage drop equal to a voltage drop in the NPN transistor. In addition, a constant-current circuit for supplying a constant current is connected to the gate of the detection transistor, and another transistor for constituting a current mirror circuit together with the NPN transistor is connected to the gate of the output transistor. This circuit arrangement prevents a limit value of the load current from fluctuating due to the non-uniformity of circuit elements or the like, thus achieving high-accuracy load-current limitation.

22 Claims, 12 Drawing Sheets

FOREIGN PATENT DOCUMENTS

| | | |
|---|---|---|
| EP | 0483744 | 5/1992 |
| FR | 2679082 | 1/1993 |
| GB | 2078036 | 12/1981 |
| GB | 2248739 | 4/1992 |
| JP | 55-7092 | 6/1979 |
| JP | 57-8818 | 1/1982 |
| JP | 59-138912 | 9/1984 |
| JP | 59-208618 | 11/1984 |
| JP | 2-226808 | 9/1990 |
| JP | 5-235365 | 9/1993 |
| JP | 5-327442 | 12/1993 |
| JP | 7-52370 | 6/1995 |
| JP | 7-321621 | 12/1995 |
| JP | 8-47168 | 2/1996 |
| JP | 8-242580 | 9/1996 |
| JP | 10-32475 | 2/1998 |
| JP | 10-135804 | 5/1998 |
| WO | WO85/03818 | 8/1985 |

\* cited by examiner

LOAD ACTUATION CIRCUIT

BACKGROUND OF THE INVENTION

1) Field of the Invention

The present invention relates to a load actuation circuit for driving a load, and more particularly to a load actuation circuit having a function to place a limit on a load current below a predetermined current value.

2) Description of the Related Art

So far, as a load actuation circuit designed to limit a load current when the load current falls into an excess current condition, there has known one disclosed in Japanese Unexamined Patent Publication (HEI) 2-226808, in which a current detection transistor (which will be referred to hereinafter as a "detection transistor") comprising a MOS transistor whose drain and gate are respectively connected to a drain and gate of a MOS transistor forming an output transistor in the form of common lines is provided, and gates and one transistor (which will be referred to hereinafter as a "first transistor") constituting a current mirror circuit is located on the source side of this detection transistor so that a load current flowing through the output transistor into a load is limited below a predetermined value by controlling a gate voltage of the output transistor according to a current flowing through the other transistor (which will be referred to hereinafter as a "second transistor") organizing the same current mirror circuit.

There is a problem which arises with the load actuation circuit disclosed in this publication, however, in that, since the gate of the output transistor and the gate of the detection transistor are connected through a resistor to each other or directly wired together, difficulty is encountered in establishing the correspondence between the gate-source voltage of the output transistor and the gate-source voltage of the detection transistor, which can cause no coincidence in operating point between these transistors.

That is, the first transistor constituting the current mirror circuit is connected to the source side of the detection transistor whereas no transistor is coupled to the source side of the output transistor; therefore, an electric potential difference corresponding to a voltage drop (in a case in which the first transistor is a bipolar transistor, the forward voltage Vf in a P-N junction becomes approximately 0.7V), developing due to a current flowing through the first transistor, occurs between the source electric potentials of these transistors, thereby causing a difference in operating point between the output transistor and the detection transistor.

The occurrence of an operating point difference makes it difficult to precisely detect a load current flowing from the detection transistor to the output transistor so that high-accuracy current limitation becomes unfeasible.

Meanwhile, as a load actuation circuit capable of solving such a problem, this applicant has already proposed a circuit arrangement in which a voltage drop means is located between a gate of an output transistor and a gate of a detection transistor to produce a voltage drop equal to that in a first transistor (Japanese Unexamined Patent Publication (HEI) 10-32475).

Referring to FIG. 15, a description will be given hereinbelow of an example of this proposed load actuation circuit.

FIG. 15 shows a load actuation circuit in which an N-channel MOS transistor is employed as each of an output transistor To and a detection transistor Ts, and the drain of the output transistor To is connected through an output terminal 4 to one terminal of a load 2, with the other terminal thereof receiving a positive power-supply voltage from the positive terminal (electrode) of a direct-current power source for load actuation, while the source of the output transistor To is coupled through an output terminal 6 to the ground equal in electric potential to the negative terminal (electrode) side of the dc power source so that the output transistor To operates as the so-called low-side switch.

In addition, as FIG. 15 shows, according to the above-mentioned proposed load actuation circuit, the drain of the detection transistor Ts is connected to the drain of the output transistor To and the source of the detection transistor Ts is connected to the source of the output transistor To through one transistor (first transistor) Ta constituting a current mirror circuit 10, with the other transistor (second transistor) Tb of the same current mirror circuit 10 being connected between the gate and source of the output transistor To, and even a voltage drop means 20 which produces a voltage drop in the first transistor Ta due to a current proportional to a load current flowing through the detection transistor To and reaching the first transistor Ta is provided between the gates of the output transistor To and the detection transistor Ts.

Accordingly, with the foregoing proposed load actuation circuit, while a load current flows through the output transistor To, the drain-source voltage of the output transistor To agrees with the drain-source voltage of the detection transistor Ts to cause a current proportional to the load current to flow certainly in the detection transistor Ts; therefore, as compared with a case in which the drains of the output transistor To and the detection transistor Ts are connected directly to each other or connected to each other in a state where a resistor is interposed therebetween, the load current flowing through the output transistor To is limitable with higher accuracy.

However, in the case of the foregoing proposed load actuation circuit, as FIG. 15 shows, a constant-voltage circuit 50 is provided to generate a constant voltage from a power-supply voltage fed from the external through a power supply terminal 8 so that the constant voltage generated by the constant-voltage circuit 50 is applied through a resistor Ra to a control terminal (concretely, gate) of the detection transistor Ts to actuate the output transistor To and the detection transistor Ts at the constant voltage; therefore, because of the non-uniformity of the output transistor To or the resistor Ra, its temperature property, or the like, there exists a probability of difficulty being experienced in controlling the load current flowing through the output transistor To to a design value.

More concretely, as obvious from a VGS-ID characteristic curve shown in FIG. 16, a load current (in other words, drain current) ID flowing through the output transistor To rises rapidly with an increase in gate-source voltage VGS.

Meanwhile, in the load actuation circuit shown in FIG. 15, a current supplied from the constant-voltage circuit 50 through the resistor Ra to the gate side of the detection transistor Ts depends on a resistance value of the resistor Ra and a voltage across the resistor Ra, thus lowering as the gate-source voltage VGS of the output transistor To increases. For this reason, a supply-possible current (in detail, a conversion value of this current into a drain current ID) from the constant-voltage circuit 50 to the second transistor Tb of the current mirror circuit 10 also decreases as the gate-source voltage VGS of the output transistor To increases, as seen from a supply current characteristic indicated by a solid line in FIG. 16.

In addition, in the load actuation circuit shown in FIG. 15, when a current (current proportional to the load current)

flowing from the detection transistor Ts to the first transistor Ta of the current mirror circuit 10 fails of its supply to the second transistor Tb, the gate voltage of the output transistor To lowers to limit the load current (drain current ID) to the current value at that time so that the limit values of the load current become drain current values ID at the intersections (indicated by black circles in FIG. 16) of the MOS transistor VGS-ID characteristic and the supply current characteristic.

However, as indicated by dotted lines in FIG. 16, the MOS transistor VGS-ID characteristic varies in accordance with the non-uniformity of characteristic of the MOS transistor itself or its temperature variation or fluctuation, and the supply current characteristic from the constant-voltage circuit 50 to the current mirror circuit 10 also varies with the non-uniformity of the characteristic of the resistor Ra or the transistor Ta, Tb constituting the current mirror circuit 10, or its temperature variation.

Thus, although the foregoing proposed load actuation circuit allows a current proportional to a load current flowing through the output transistor To to be supplied through the detection transistor Ts to the first transistor Ta of the current mirror circuit 10, the load current limitable through the current mirror circuit 10 varies due to the non-uniformity of each of the aforesaid circuit elements or its temperature variation, which makes it difficult to control the load current flowing through the output transistor To to a design value.

SUMMARY OF THE INVENTION

Accordingly, the present invention has been developed with a view to eliminating the above-mentioned problems, and it is therefore an object of the invention to provide a load actuation circuit capable of limiting a load current to a value below a predetermined value with high accuracy without suffering the effects of the non-uniformity of characteristics of circuit elements or their temperature variation.

For this purpose, rather than the above-described related art in which a constant voltage is applied as a load actuation control signal through a resistor to each of control terminals of an output transistor and a detection transistor, in a load actuation circuit according to an aspect of the present invention, a constant current is supplied from a constant-current circuit to an output transistor and a detection transistor. Thus, each of the output transistor and the detection transistor is driven with the constant current, and there is no need to put a resistor in a supply path of the drive current. This can prevent a load current flowing through the output transistor from varying due to the non-uniformity of this resistor or its temperature variation. Accordingly, the present invention can prevent the variation of the limitable load current stemming from the non-uniform characteristics of the circuit elements or their temperature variation, thus limiting the load current to a value below a predetermined value with high accuracy.

Another aspect of the invention provides a load actuation circuit in which the foregoing aspect of the invention is introduced into the load actuation circuit shown in FIG. 14. That is, in the load actuation circuit according to this aspect of the invention, as illustrated in FIG. 1, a series circuit comprising a detection transistor Ts and a first transistor Ta is connected in parallel to an output transistor To for supplying a load current to a load 2, and a voltage drop means 20, being designed to produce a voltage drop substantially equal to a voltage drop developing in the first transistor Ta when a current proportional to the load current flows through the detection transistor Ts, is located between control terminals of the output transistor To and the detection transistor Ts (in FIG. 1, between the gates of these transistors). In addition, a constant-current circuit 30, being designed to supply a constant current Ic as a control signal for load actuation, is connected to the control terminal (in FIG. 1, gate) of the detection transistor Ts, while a second transistor Tb, constituting a current mirror circuit 10 together with the first transistor Ta and varying a voltage level (in FIG. 1, gate voltage) at the control terminal of the detection transistor Ts through the use of a current proportional to the load current flowing through the detection transistor Ts, is connected to the control terminal (in FIG. 1, gate) of the output transistor To.

Accordingly, with this load actuation circuit, not only an operation of the voltage drop means 20 can make a correspondence or coincidence in operating point between the output transistor To and the detection transistor Ts as in the case of the related load actuation circuit shown in FIG. 15, but also the constant current Ic can be supplied as a control signal, for turning on the output transistor To, from the constant-current circuit 30 to the control terminal of the detection transistor Ts so that the load current becomes constant when the second transistor Tb turns off the output transistor.

That is, as illustrated in FIG. 1, in a case in which each of the output transistor To and the detection transistor Ts is constructed using an N-channel MOS transistor as with the related art circuit shown in FIG. 15 and a constant current Ic is fed as a load actuation control signal from the constant-current circuit 30 to the control terminal of the detection transistor Ts, as seen from the supply current characteristic indicated by a solid line in FIG. 2, the current (in detail, a conversion value of this current into a load current drain current ID) to be supplied from the constant-current circuit 30 to the current mirror circuit 10 becomes nearly constant until the gate-source voltage VGS of the output transistor To reaches a predetermined voltage at which the generation of the constant current Ic from the power-supply voltage fed from the external through the power supply terminal 8 becomes unfeasible in the constant-current circuit 30.

Accordingly, with this load actuation circuit, as FIG. 2 shows, even if the MOS transistor VGS-ID characteristic varies due to the non-uniformity of characteristic of the MOS transistor itself or its temperature variation, the load current (drain current ID) limitable through the current mirror circuit 10 becomes nearly constant.

In consequence, this load actuation circuit can prevent the limit value of the load current limitable through the current mirror circuit 10 from varying due to the non-uniformity of characteristics of circuit elements such as the output transistor To, unlike the related art load actuation circuit shown in FIG. 15, thus achieving high-accuracy limiting of the load current.

In the load actuation circuit shown in FIG. 1, although, in conjunction with the related art circuit shown in FIG. 15, an N-channel MOS transistor is employed as each of the output transistor To and the detection transistor Ts and the drain of the output transistor To is connected through the output terminal 4 to one terminal of the load 2, whose other terminal receives a positive power-supply voltage from the positive terminal of the load actuation dc power source, while the source of the output transistor To is wired through the output terminal 6 to the ground equal in electric potential to the negative terminal side of the dc power source so that the output transistor To acts as the so-called low-side switch, for example, in a case in which a load actuation circuit according to the present invention is constructed as a high-side type load actuation circuit shown in FIG. 1, it is also possible that the output transistor To and the detection transistor Ts are constructed with an NPN-type bipolar transistor.

In addition, in a case in which a load actuation circuit is arranged as a so-called high-side type load actuation circuit in which the output transistor To is located on a current path extending from the positive terminal of a dc power source to the load 2, it is also acceptable that, for example, the output transistor To and the detection transistor Ts are constructed with a P-channel MOS transistor or a PNP-type bipolar transistor.

In the case of the employment of a MOS transistor for the output transistor To and the detection transistor Ts, as compared with a bipolar transistor, the MOS transistor can provide a larger current to supply a larger load current to the load. In this case, preferably, the drains of the output transistor To and the detection transistor Ts are connected to each other while the gates, i.e., the control terminals, of these transistors To and Ts are connected through the voltage drop means 20 to each other.

In addition, for the employment of the MOS transistor for the output transistor To and the detection transistor Ts, since an N-channel MOS transistor generally provides a larger current than that of a P-channel MOS transistor, it is more preferable that the output transistor To and the detection transistor Ts are produced with an N-channel MOS transistor. Incidentally, in this case, the constant-current circuit 30 introduces a constant current Ic into the gate of the detection transistor Ts while the second transistor Tb accepts or takes in the constant current Ic fed from the constant-current circuit 30 through the voltage drop means 20 to the gate of the output transistor To.

Still additionally, for the use of the MOS transistor for the output transistor To, even when the output of the constant current Ic from the constant-current circuit 30 is ceased for turning off the output transistor To, the discharge of electric charge accumulated in the parasitic capacity of the MOS transistor constituting the output transistor To is time-consuming, and the output transistor To can defy quick turning-off.

For this reason, in the foregoing load actuation circuit, it is preferable that a discharging means is additionally provided to discharge the electric charge from the gate of the output transistor at the turning-off of the output transistor To. This can turn off the output transistor To promptly at the time of ceasing the current supply to the load 2 to break the load current promptly.

Furthermore, it is also acceptable that the first transistor Ta and the second transistor Tb, constituting the current mirror circuit 10, are made with a bipolar transistor, or that they are made with a MOS transistor.

In the case of the employment of a bipolar transistor as each of the first and second transistors Ta and Tb, preferably, the bases of these bipolar transistors are connected in a common form and the emitters thereof are likewise connected together, and the collector of the bipolar transistor forming the first transistor Ta is connected to the bases connected in the common form and to the detection transistor Ts while the collector of the bipolar transistor forming the second transistor Tb is coupled to the control terminal of the output transistor To.

Preferably, for the employment of the bipolar transistor for the first and second transistors Ta and Tb, the voltage drop means 20 is produced with a semiconductor device such as a diode which generates a forward voltage by a PN junction. That is, the use of such a semiconductor device for the voltage drop means 20 can generate a voltage drop similar to the voltage drop in the second transistor Tb, thereby accomplishing the correspondence in operating point between the output transistor To and the detection transistor Ts.

On the other hand, in the case of the employment of a MOS transistor for each of the first and second transistors Ta and Tb, it is preferable that the gates of the first and second transistors Ta and Tb are connected in a common form and the sources thereof are likewise wired together, and the drain of the MOS transistor constituting the first transistor Ta is connected to the gates connected in a common form and to the detection transistor Ts while the drain of the MOS transistor organizing the second transistor Tb is coupled to the control terminal of the output transistor To.

In addition, preferably, for the employment of a MOS transistor for each of the first and second transistors Ta and Tb, the voltage drop means 20 is made using the same MOS transistor so that a voltage drop takes place due to its gate-source voltage. That is, such a configuration of the voltage drop means 20 can generate a voltage drop equivalent to the voltage drop in the second transistor Tb comprising a MOS transistor, thus achieving the coincidence in operating point between the output transistor To and the detection transistor Ts.

Furthermore, it is also appropriate that the constant-current circuit 30 is composed of a third transistor and a fourth transistor, constituting a current mirror circuit, and a constant-current source, together with the third transistor, connected between positive and negative power-supply lines to supply a constant current Ic to the third transistor, with the fourth transistor being connected to the control terminal of the detection transistor Ts so that a constant current Ic proportional to a current flowing through the third transistor is supplied through the fourth transistor to the control terminal of the detection transistor Ts.

That is, this arrangement of the constant-current circuit 30 enables the supply voltage to the constant-current source to correspond to the power-supply voltage applied to the positive and negative power-supply lines at all times irrespective of voltage variation at the control terminal of the detection transistor Ts, which permits a stable constant current Ic to be supplied through the fourth transistor to the control terminal of the detection transistor Ts.

In addition, also with this arrangement of the constant-current circuit 30, the third and fourth transistors organizing the current mirror circuit can also be constructed with a bipolar transistor or a MOS transistor as in the case of the first and second transistors Ta and Tb constituting the above-mentioned load current limiting current mirror circuit 10.

In the case of the employment of a bipolar transistor for each of the third and fourth transistors, the bases of these transistors are connected to each other in a common form and the emitters thereof are likewise connected to each other in a common form, with the collector of the bipolar transistor constituting the third transistor being connected to the bases connected in the common form and the constant-current source while the collector of the bipolar transistor organizing the fourth transistor being connected to the control terminal of the detection transistor Ts.

Meanwhile, in the case of the configuration of the third and fourth transistors using the bipolar transistors, the collector-emitter voltage of the fourth transistor may vary so that a current to be fed from the constant-current circuit 30 to the control terminal side of the detection transistor Ts shows variation due to the Early effect of the fourth transistor.

The Early effect of the bipolar transistor signifies that, on an increase in the collector-emitter voltage, the depletion layer in the collector-base junction extends toward the base area side to reduce the effective base width, thereby increasing the collector current. Thus, as the control terminal voltage of the detection transistor Ts (in its turn, the output transistor To) decreases, the current to be fed to the control terminal side of the detection transistor Ts becomes larger. In consequence, when the Early effect occurs in the fourth transistor, the supply current characteristic shows slight inclination as indicated by a chain line in FIG. 2, and as the gate-source voltage VGS increases, the limitable load current (drain current ID) decreases.

Accordingly, in order to avoid such a problem, it is preferable that a fifth transistor and a sixth transistor each comprising a bipolar transistor identical to the fourth transistor and having a function to cancel the Early effect are provided with respect to the fourth transistor.

That is, according to this configuration, in the constant-current circuit 30 included in the foregoing load actuation circuit, there are provided a fifth transistor whose base is connected to the collector of the fourth transistor, whose emitter is connected to the emitter of the fourth transistor and whose collector is connected to the power-supply line to the constant-current source on the opposite side to the third transistor, and a sixth transistor whose emitter is connected to the collector of the fourth transistor, whose base is connected to the collector of the fifth transistor and whose collector is connected to the control terminal of the aforesaid detection transistor Ts, so that a constant current Ic proportional to a current flowing through the third transistor is fed through the sixth transistor to the control terminal of the detection transistor Ts.

Thus, according to the load actuation circuit based on this configuration, also for the use of the bipolar transistor for each of the third and fourth transistors constituting the current mirror circuit in the constant-current circuit 30, it is possible that the collector-emitter voltage of the fourth transistor is fixed at the base-emitter forward voltage Vf (approximately 0.7V) of the fifth transistor to cancel the Early effect of the fourth transistor. Thus, this load actuation circuit can lead the constant current Ic, proportional to the current flowing through the third transistor, from the fourth transistor to the sixth transistor to supply it from the sixth transistor to the control terminal side of the detection transistor Ts.

Accordingly, this load actuation circuit is capable of stably supplying the constant current Ic to the control terminal side of the detection transistor Ts without suffering the Early effect of the fourth transistor, thus limiting the load current to a value below a predetermined value with high accuracy.

Furthermore, the constant-current circuit 30 supplies a constant current Ic to the control terminal of the detection transistor Ts for actuating the detection transistor Ts directly and driving the output transistor To through the voltage drop means 20, and further supplies a current corresponding to a current flowing through the detection transistor Ts to the second transistor Tb constituting the current limiting current mirror circuit 10, and in this case, a minimum output voltage of the constant-current circuit 30 needed for the actuation of the output transistor To is a control terminal voltage needed for turning on the output transistor To (in the case of the output transistor To comprising an N-channel MOS transistor shown in FIG. 1, a threshold voltage of the MOS transistor) plus a voltage drop developing owing to the voltage drop means 20.

Accordingly, the power-supply voltage (the power-supply voltage to be applied to the aforesaid positive and negative power-supply lines) to be supplied to the constant-current circuit 30 is also required to be set so that the output voltage from the constant-current circuit 30 becomes above this voltage. For example, if the power-supply voltage varies to a value lower than this voltage, then the actuation (turning-on) of the output transistor To becomes unfeasible.

For this reason, in order to continue the load actuation when the power-supply voltage fluctuates (lowers), it is preferable that, in the aforesaid constant-current circuit 30, a bipolar transistor (the fourth transistor or sixth transistor) whose collector is connected to the control terminal of the detection transistor Ts is arranged such that a second collector is provided in a state connected to the control terminal of the output transistor To to further supply a constant current Ic directly through the second collector to the control terminal of the output transistor To.

In this way, not only the detection transistor Ts but also output transistor To can be driven directly by the supply of the constant current Ic from the constant-current circuit 30, which can lower the minimum voltage, ensuring the actuation (turning-on) of the output transistor To even when the power-supply voltage fluctuates (lowers), according to (by) the voltage drop due to the voltage drop means 20, thus achieving more stable load actuation.

Still furthermore, in the above-mentioned load actuation circuit, since the output transistor To and the detection transistor Ts are driven by the supply of the constant current Ic from the constant-current circuit 30, the control terminal voltage of each of these transistors To and Ts (in other words, the output voltage of the constant-current circuit 30) increases to the vicinity of the power-supply voltage in the constant-current circuit 30. Hence, these transistors To and Ts can be destroyed when the constant-current circuit 30 has a high power-supply voltage.

For this reason, in the load actuation circuit according to the invention, it is preferable that a clamping means is provided to hold down (clamp) the control terminal voltage of the output transistor To to a value below a predetermined voltage. This can prevent the control terminal voltage of the output transistor To (namely, the control terminal voltage of the detection transistor Ts) from becoming excessive to destroy the transistors To and Ts.

For example, in this case, it is also appropriate that this clamping means is made to directly hold down the control terminal voltage of the output transistor To to a value below the predetermined voltage, or to hold down the power-supply voltage to be fed to the constant-current circuit 30 to a value below a predetermined value for indirectly holding down the control terminal voltage of the output transistor To to a value below the predetermined voltage.

Moreover, it is also appropriate that the foregoing load actuation circuit further comprises a seventh transistor constituting a current mirror circuit together with the first transistor Ta and the second transistor Tb, and an interrupting (intermittent) control circuit for turning off the output transistor To and the detection transistor Ts when detecting, on the basis of a current flowing through the seventh transistor, the fact that the load current reaches an excessive current above a predetermined value and for turning on the output transistor To and the detection transistor Ts when afterwards detecting the fact that the load current assumes no excessive current. That is, this load actuation circuit is designed to lessen the loss in the output transistor To during the excessive current by turning off the output transistor To when the load current is in an excessive current condition.

In this connection, in the case in which the interrupting control circuit turns on/off the output transistor To and the detection transistor Ts, it is preferable that a delay means is provided in the interrupting control circuit to turn off the output transistor To and the detection transistor Ts after the elapse of a predetermined period of time from the detection of the excessive current. This can prevent the output transistor To from being turned off in error because a rush current at the start of energization to the load 2 is handled as an excessive current.

In addition, in this case, it needs that the load current to be detected as an excessive current by the interrupting control circuit is set at a value lower than a load current limit value depending on a supply current from the constant-current circuit 30 and a current value flowing through the second transistor Tb. This means that, if an excessive-current decision value in the interrupting control circuit exceeds the load current limit value, the load current undergoes the limiting operation on the basis of the current flowing through the second transistor Tb prior to the detection of the excessive current by the interrupting control circuit, thus ruining the function of the interrupting control circuit.

Meanwhile, in the foregoing load actuation circuit according to the invention, since the voltage drop means for creating a voltage drop corresponding to one-stage of transistors constituting a current mirror circuit is put between the control terminal of the output transistor To and the control terminal of the detection transistor Ts to achieve the correspondence in operating point between the output transistor To and the detection transistor Ts, for example, if the power-supply voltage drops temporarily so that difficulty is experienced in supplying a desired current to the voltage drop means, then the electric potential at the control terminal of the output transistor To becomes unstable, which may reflect on a normal load current limiting operation.

Accordingly, in a case in which the load actuation circuit according to the invention is put to use under such conditions as motor vehicles where the power-supply voltage tends to fluctuate, it is preferable that a bias means is provided to form a current path, for bypassing the second transistor Tb, between the control terminal and output terminal of the output transistor To, thereby stabilizing the operation of the output transistor To.

In this way, even if the power-supply voltage drops, the bias means ensures the introduction of the current into the voltage drop means so that the voltage drop means generates a desired voltage drop. Thus, with the load actuation circuit according to the invention, even if the power-supply voltage lowers, the coincidence in operating point between the output transistor To and the detection transistor Ts takes place to accomplish a stable load current limiting operation.

On the other hand, the second transistor Tb is for introducing a constant current, flowing through the voltage drop means 20 into the control terminal side of the output transistor To, into the power-supply line side (in FIG. 1, the ground line forming the negative power-supply line) in accordance with a current flowing through the detection transistor Ts to place a limit on the load current, and for example, if the electric potential on the power-supply line connected to the output terminal of the second transistor Tb fluctuates with an increase in the load current or the like, then the operation of the second transistor Tb (namely, the current mirror circuit 10) becomes unstable, which may reflect on the normal load current limiting operation by the second transistor Tb.

Accordingly, for solving this problem, it is preferable that a bias means is provided to form a current path between the control terminal of the second transistor Tb and the power-supply line with which the output terminal of the second transistor Tb is in connection, which can stabilize the operation of the second transistor Tb (namely, the current mirror circuit 10).

In this way, even if the electric potential on the power-supply line to which connected is the output terminal, being one of the two output terminals (drain and source or collector and emitter) of the second transistor Tb, on the opposite side to the output terminal (the other output terminal) connected to the control terminal of the output transistor To, the bias means can maintain the electric potential difference at the control terminal of the second transistor Tb with respect to the power-supply line in almost constant condition, thus preventing the operation of the second transistor Tb, namely the current mirror circuit 10, from becoming unstable due to the electric potential variation of the power supply line.

In this case, since a need exists only that the bias means flows a very small current so as not to exert influence on the operation to be conducted for when the power-supply voltage or the power-supply line electric potential is in a stable condition, concretely a resistor having a relatively large resistance or a constant-current circuit forcing a very small current to flow can be used as the bias means.

BRIEF DESCRIPTION OF THE DRAWINGS

Other objects and features of the present invention will become more readily apparent from the following detailed description of the preferred embodiments taken in conjunction with the accompanying drawings in which.

DESCRIPTION OF THE PREFERRED EMBODIMENTS

Embodiments of the present invention will be described hereinbelow with reference to the drawings.
(First Embodiment)

Figure 3:
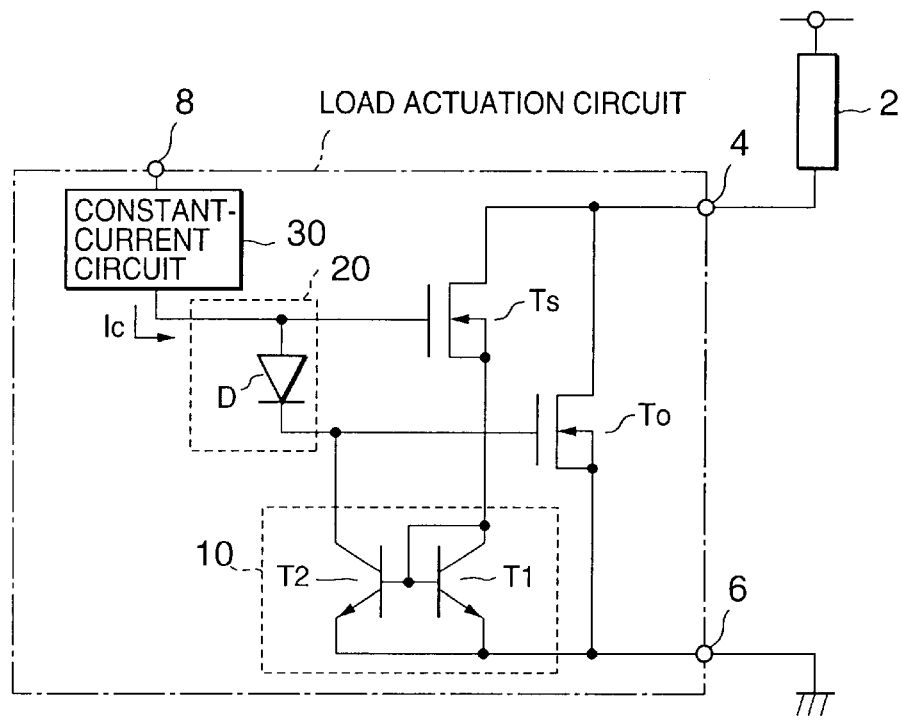
FIG. 3 is an electric circuit diagram showing an arrangement of a load actuation circuit according to a first embodiment.

FIG. 3 is an electric circuit diagram showing an arrangement of a load actuation circuit according to a first embodiment of the invention.

Figures 1, 2:
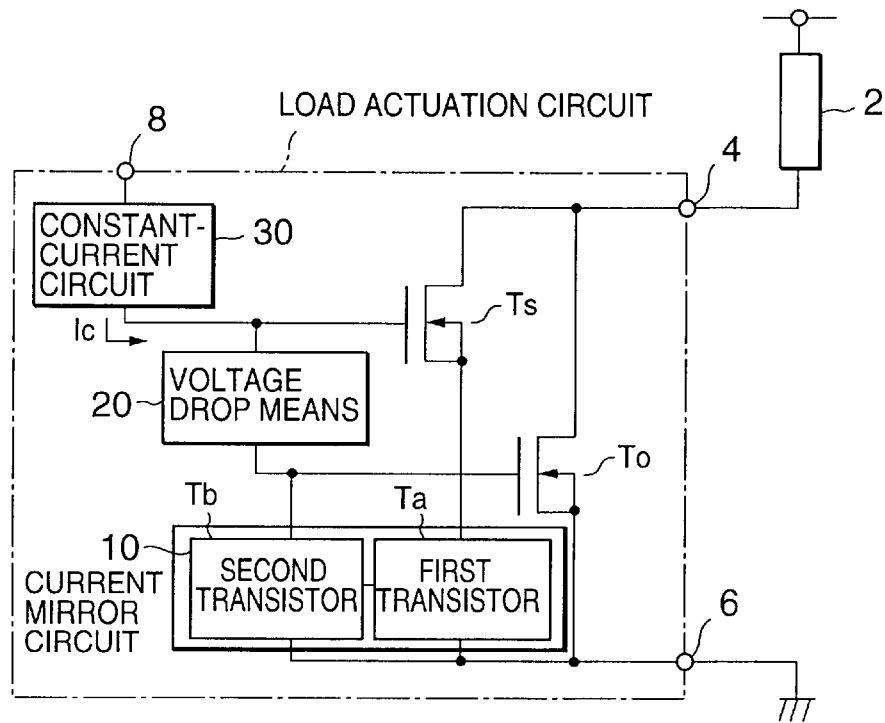
FIG. 1 is a block diagram showing an example of basic arrangement of a load actuation circuit according to the present invention.
FIG. 2 is an illustration useful for explaining a load current limiting operation in the load actuation circuit according to the invention.

The load actuation circuit according to the first embodiment is, as with the basic circuit illustrated in FIG. 1, of a so-called low-side type in which an N-channel MOS transistor is employed as each of an output transistor To and a detection transistor Ts and the drain of the output transistor To is connected through an output terminal 4 to one terminal (end) of a load 2 whose other terminal is in connection with the positive terminal side of a dc power source for load actuation while the source of the output transistor To is coupled through an output terminal 6 to the ground equal in electric potential to the negative terminal side of the load actuation dc power source.

In addition, in the load actuation circuit according to this embodiment, the drain of the detection transistor Ts is connected to the drain of the output transistor To while the source of the detection transistor Ts is connected through an NPN transistor T1 serving as a first transistor constituting a current mirror circuit 10 to the source of the output transistor To, and even a diode D, constituting a voltage drop means 20 in a state where the gate side of the detection transistor Ts acts as the anode and the gate side of the output transistor To serves as the cathode, is placed between the gates of the detection transistor Ts and the output transistor To. Incidentally, the current mirror circuit 10 corresponding to load current limiting means in the appended claim.

Still additionally, in the current mirror circuit 10, the collector of the NPN transistor T1 forming the first transistor is connected to the source of the detection transistor Ts, and the emitter thereof is connected to the source of the output transistor To, and even the base thereof is connected to its own collector, with the base being further connected to the base of an NPN transistor T2, acting as a second transistor, in a common form (through a common line). The emitter of the NPN transistor T2 forming the second transistor is connected to the emitter of the NPN transistor T1 in a common form, while the collector thereof is connected to the gate of the output transistor To.

Furthermore, in the load actuation circuit according to this embodiment, to the gate of the detection transistor Ts there is connected a constant-current circuit 30 which receives a power supply from the external through a power-supply terminal 8 to generate a constant current. This constant-current circuit 30 provides a constant current Ic to the gate side of the detection transistor Ts.

In the load actuation circuit thus arranged according to this embodiment, in the actuation of the load 2, a power-supply voltage is supplied through the power-supply terminal 8 to the constant-current circuit 30 to place the constant-current circuit 30 in operation. Accordingly, the constant-current circuit 30 outputs the constant current Ic to the gate side of the detection transistor Ts so that a current is injected into the gate of the detection transistor Ts and further a current is introduced through the diode D into the gate of the output transistor To. The result is that the gate-source voltages VGS of the detection transistor Ts and the output transistor To exceed threshold voltages of these transistors Ts and To, respectively, so that these transistors Ts and To are triggered into their on-conditions. At this time, the supply of a load current to the load 2 takes place through the output transistor To.

In addition, at this time, if the load 2 has a low impedance for some reason, such as short-circuit, the load current exceeds the normal operating current, and the voltage at the output terminal 4 rises. Still additionally, if this voltage at the output terminal 4 exceeds a voltage at which a base voltage can be supplied to the NPN transistor T1 forming the first transistor, that is, the base-emitter forward voltage, a portion of the load current (in other words, a current proportional to the load current) flows through the detection transistor Ts.

This current decreases by a factor of n in the current mirror circuit 10 comprising the NPN transistors T1 and T2, and the NPN transistor T2 forming the second transistor extracts or draws a current corresponding to the 1/n current from the gate side of the output transistor To.

Moreover, at this time, when the current drawn by the NPN transistor T2 is smaller than the constant current Ic to be supplied from the constant-current circuit 30, the output transistor To and the detection transistor Ts are maintained in the on-condition. On the other hand, if the load current further increases so that the current drawn by the NPN transistor T2 exceeds the constant current Ic to be supplied from the constant-current circuit 30, the constant current from the constant-current circuit 30 is absorbed into the NPN transistor T2 side so that the gate voltages of the output transistor To and the detection transistor Ts drop to reduce the load current. In consequence, the load current is limited to a value below a predetermined value.

The limit value Imax of the load current in the current mirror circuit 10 can be expressed according to the following equation (1) when the ratio of the current flowing through the output transistor To and the current flowing through the detection transistor Ts (namely, the NPN transistor T1) is taken as m:1 while the ratio of the current flowing through the NPN transistor T1 and the current flowing through the NPN transistor T2 is taken as n:1.

$$Imax = Ic \times m \times n \qquad (1)$$

That is, in the load actuation circuit according to this embodiment, the load current limit value Imax depends only on the constant current Ic supplied from the constant-current circuit 30 and the feedback constants (m, n) of the load current by the detection transistor Ts and the current mirror circuit 10, and as mentioned above with reference to FIG. 2, does not depend upon electrical characteristics of other circuit elements, such as the non-uniformity of the VGS-ID characteristic of the output transistor To.

Furthermore, in the operation of the current mirror circuit 10, the source electric potential of the detection transistor Ts steps up by a value corresponding to (according to) the base-emitter voltage of the NPN transistor T1 with respect to the source electric potential of the output transistor To. However, since the diode D is interposed between the gates of these transistors Ts and To, the gate voltage of the output transistor To becomes higher by a value corresponding to the forward voltage of the diode D than the gate voltage of the detection transistor Ts. Therefore, the gate-source voltages of the output transistor To and the detection transistor Ts becomes equal to each other to set up the coincidence in operating point between these transistors To and Ts.

Thus, the load actuation circuit according to this embodiment can limit the load current to a value below a desired current limit value with high accuracy.

In this embodiment, although the diode D is used as the voltage drop means 20, since the voltage drop means 20 is for generating a voltage equal to the base-emitter voltage of the NPN transistor T1 in the current mirror circuit 10, it is also possible to use another means using a PN junction for producing a forward voltage, for example, a bipolar transistor whose base and emitter are coupled to each other in a common form, or a bipolar transistor whose base and collector are in a common form. Additionally, it is also acceptable to use other means provided that it develops a voltage drop equivalent substantially to the base-emitter voltage of the NPN transistor T1.

(Second Embodiment)

Figure 4:
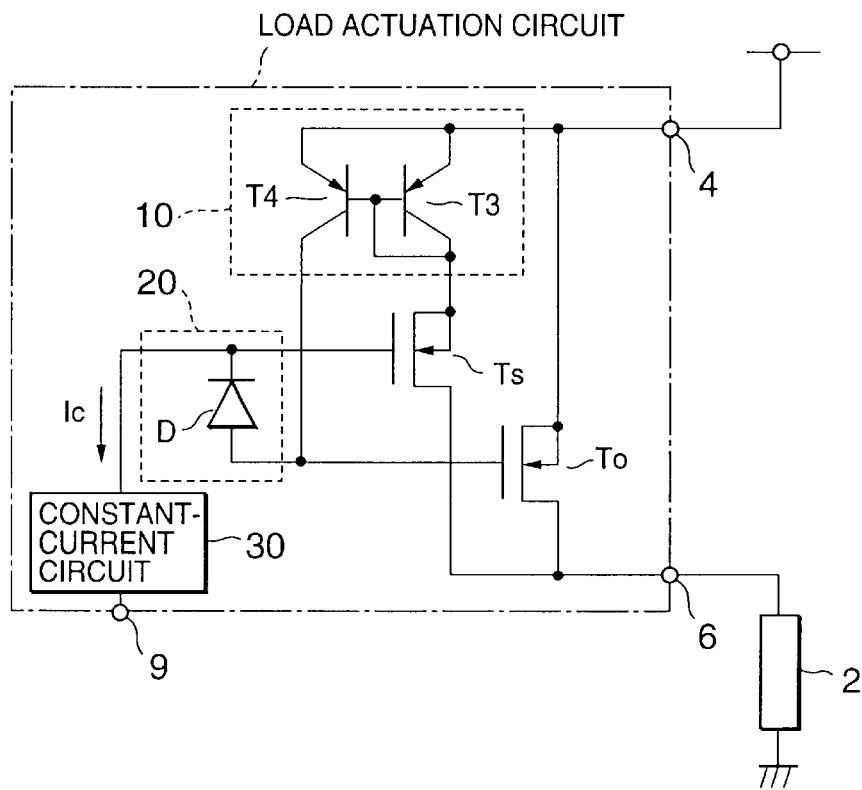
FIG. 4 is an electric circuit diagram showing an arrangement of a load actuation circuit according to a second embodiment.

FIG. 4 is an electric circuit diagram showing an arrangement of a load actuation circuit according to a second embodiment of the invention.

The load actuation circuit according to the second embodiment is of a so-called high-side type in which a P-channel MOS transistor is employed for each of output transistor To and detection transistor Ts, and the source of the output transistor To is connected through an output terminal 4 to the positive terminal of a load actuation dc power source while the drain of the output transistor To is connected through an output terminal 6 to one terminal of a load 2, with the other terminal thereof being connected to the ground equivalent in electric potential to the negative side of the dc power source.

In addition, in the load actuation circuit according to this embodiment, the drain of the detection transistor Ts is connected to the drain of the output transistor To while the source of the detection transistor Ts is connected through an PNP transistor T3 serving as a first transistor constituting a current mirror circuit 10 to the source of the output transistor To, and even a diode D, constituting a voltage drop means 20 in a state where the gate side of the output transistor To acts as the anode and the gate side of the detection transistor Ts serves as the cathode, is placed between the gates of the detection transistor Ts and the output transistor To.

Still additionally, in the current mirror circuit 10, the collector of the PNP transistor T3 forming the first transistor is connected to the source of the detection transistor Ts, and the emitter thereof is connected to the source of the output transistor To, and even the base thereof is connected to its own collector, with the base thereof being further connected to the base of a PNP transistor T4 acting as a second transistor in the form of a common line. The emitter of the PNP transistor T4 forming the second transistor is connected to the emitter of the PNP transistor T3 in the form of a common line, while the collector thereof is connected to the gate of the output transistor To.

Furthermore, in the load actuation circuit according to this embodiment, to the gate of the detection transistor Ts there is connected a constant-current circuit 30 which receives a power supply from the external through a power-supply terminal 9 to generate a constant current. This constant-current circuit 30 extracts a constant current Ic from the gate side of the detection transistor Ts.

In the load actuation circuit thus arranged according to this embodiment, in the actuation of the load 2, a power-supply voltage is supplied through the power-supply terminal 9 to the constant-current circuit 30 to place the constant-current circuit 30 in operation. Accordingly, the constant-current circuit 30 draws the constant current Ic from the gate side of the detection transistor Ts so that the gate voltages of the detection transistor Ts and the output transistor To drop; hence, the gate-source voltages VGS of the detection transistor Ts and the output transistor To exceed threshold voltages of these transistors Ts and To, respectively, so that these transistors Ts and To are triggered into their on-conditions. At this time, the supply of a load current to the load 2 takes place through the output transistor To.

In addition, at this time, if the load 2 has a low impedance for some reason, such as short-circuit, the load current exceeds the normal operating current, and the voltage, at the output terminal 6 goes down. Still additionally, if this voltage at the output terminal 6 exceeds a voltage at which a base voltage can be supplied to the PNP transistor T3 forming the first transistor, that is, when exceeding the base-emitter forward voltage, a portion of the load current (in other words, a current proportional to the load current) flows through the detection transistor Ts.

This current decreases by a factor of n in the current mirror circuit 10 comprising the PNP transistors T3 and T4, and the PNP transistor T4 forming the second transistor introduces a current corresponding to the 1/n current into the gate side of the output transistor To.

Moreover, at this time, when the current introduced by the PNP transistor T4 is smaller than the constant current Ic to be drawn by the constant-current circuit 30, the output transistor To and the detection transistor Ts are maintained in the on-condition. On the other hand, if the load current further increases so that the current introduced by the PNP transistor T4 exceeds the constant current Ic to be drawn by the constant-current circuit 30, the constant-current circuit 30 cannot absorb the current introduced into the gate side of the output transistor To by the PNP transistor T4 so that the gate voltages of the output transistor To and the detection transistor Ts go up to lead to reduction of the load current. In consequence, the load current is limited to below a predetermined value.

In this way, in the load actuation circuit according to this embodiment, since a P-channel MOS transistor is used for each of the output transistor To and the detection transistor Ts so that the output transistor To acts as a high-side switch, the current flowing directions from the constant-current circuit 30 and the current mirror circuit 10 and the voltage drop direction of the diode D constituting the voltage drop means 20 are in reverse to those in the above-described load actuation circuit according to the first embodiment.

However, the load current limit value Imax depending upon the current mirror circuit 10 can be expressed by the above-mentioned equation (1) as in the case of the load actuation circuit according to the first embodiment, and the coincidence in operating point between the output transistor To and the detection transistor is achievable through the operation of the voltage drop means 20 comprising the diode D. Thus, as with the first embodiment, the load actuation circuit according to this embodiment can also place a limit on the load current below a desired current limit value with high accuracy.

(Third Embodiment)

Figure 5:
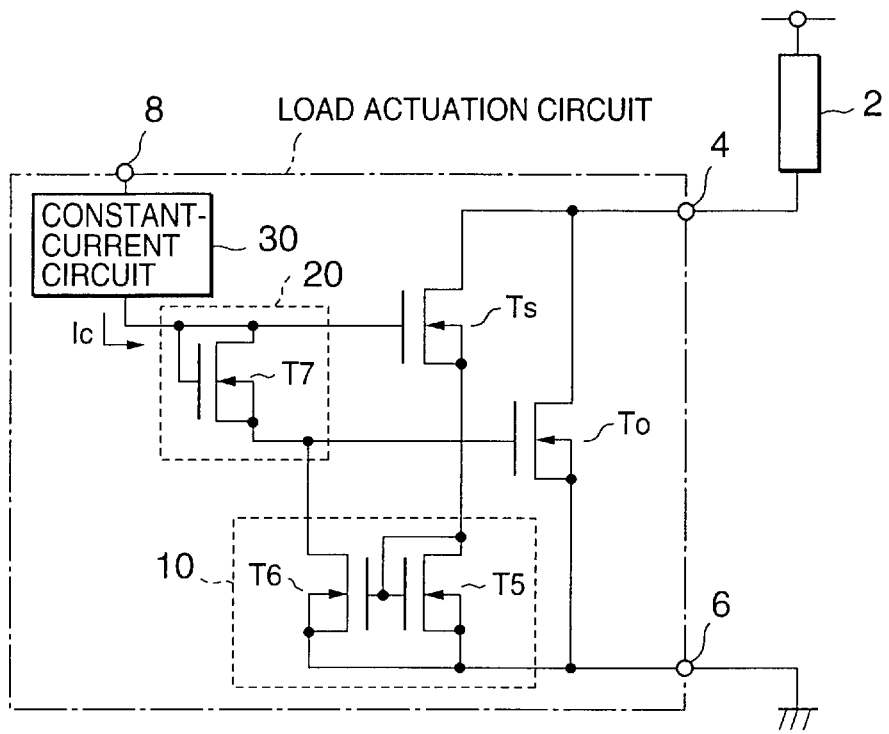
FIG. 5 is an electric circuit diagram showing an arrangement of a load actuation circuit according to a third embodiment.

FIG. 5 is an electric circuit diagram showing a configuration of a load actuation circuit according to a third embodiment of the invention.

In the load actuation circuit according to the third embodiment, with respect to the low-side type load actuation circuit according to the first embodiment shown in FIG. 3, the difference is an alteration of circuit elements constituting the current mirror circuit 10 and the voltage drop means 20, but the arrangement other than the current mirror circuit 10 and the voltage drop means 20 is the same as those in the first embodiment. Hence, the following description will be given to only the difference therebetween, and the description of the components identical to those in the first embodiment will be omitted for brevity.

As FIG. 5 shows, in this embodiment, a first transistor and a second transistor, organizing the current mirror circuit 10, are made with N-channel MOS transistors T5 and. T6, respectively, and in this connection, the voltage drop means 20 is constructed with an N-channel MOS transistor T7.

In addition, for the current mirror circuit 10, in the MOS transistor T5 acting as the first transistor, its drain is connected to the source of the detection transistor Ts, its source is connected to the source of the output transistor To, and its gate is connected to its own drain and further coupled to the gate of the MOS transistor T6 serving as the second transistor in the form of a common line. In the MOS transistor T6 forming the second transistor, its source is wired to the source of the MOS transistor T5 in the common form, while its drain is coupled to the gate of the output transistor To. Still additionally, in the MOS transistor T7 organizing the voltage drop means 20, its drain and gate are connected to the gate of the detection transistor Ts, while its source is connected to the gate of the output transistor To.

Thus, in this embodiment, although the current mirror circuit 10 is constructed with the MOS transistors T5 and T6 unlike the bipolar transistors in the first embodiment, the current limiting operation of the current mirror circuit 10 is the same as that of the first embodiment.

Furthermore, since the voltage drop means 20 is made with the MOS transistor T7 identical to the MOS transistor T5 serving as the first transistor in the current mirror circuit 10, in the operation of the current mirror circuit 10, the same voltage drop as that of the first transistor (MOS transistor T5) constituting the current mirror circuit 10 takes place between the gates of the detection transistor Ts and the output transistor To, thus setting up the correspondence in operating point between the detection transistor Ts and the output transistor To.

In consequence, the load actuation circuit according to this embodiment can also provides the same effects as those of the first embodiment to limit the load current with high precision.

(Fourth Embodiment)

Figure 6:
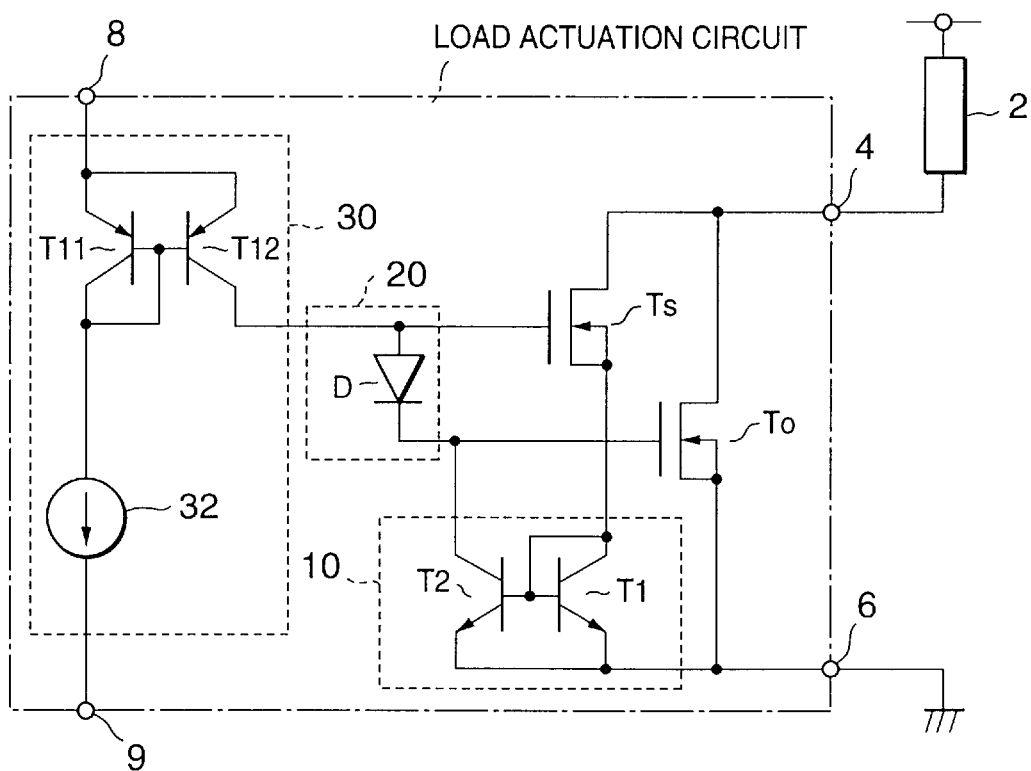
FIG. 6 is an electric circuit diagram showing an arrangement of a load actuation circuit according to a fourth embodiment.

FIG. 6 is an electric circuit diagram showing a configuration of a load actuation circuit according to a fourth embodiment of the invention.

The load actuation circuit according to the fourth embodiment features a more materialized constant-current circuit 30 in the low-side type load actuation circuit according to the first embodiment shown in FIG. 3. The arrangement other than the constant-current circuit 30 is the same as that of the first embodiment, and the following description will be given to only the constant-current circuit 30, but the other components will be omitted from the description.

As FIG. 6 shows, in this embodiment, the constant-current circuit 30 is connected through output terminals 8 and 9 to positive and negative power-supply lines (not shown) for receiving a dc power-supply voltage through these power-supply lines to be placed in operation.

Moreover, in this embodiment, a pair of PNP transistors T11 and T12 respectively acting as the aforesaid third and fourth transistors constituting a current mirror circuit are provided in the interior of the constant-current circuit 30, and a constant-current source 32 functioning as a bias circuit is connected in series to the PNP transistor T11 forming the third transistor to supply a constant current to the PNP transistor T11 so that a constant current proportional to this constant current is carried through the PNP transistor T12 forming the fourth transistor into the gate side of the detection transistor Ts.

That is, in the constant-current circuit 30, the PNP transistor T11 is arranged such that its emitter is connected through the power-supply terminal 8 to the positive power-supply line, its collector is connected through the constant-current source 32 and the power-supply terminal 9 to the negative power-supply line, and its base is engaged with its own collector, with the base being connected to the base of the PNP transistor T12 in a common form. In addition, in the PNP transistor T12, its emitter is connected to the emitter of the PNP transistor T11 in a common form while its collector is wired to the gate of the detection transistor Ts.

Thus, a constant current proportional to the current flowing through the PNP transistor T11 according to the operation of the constant-current source 32 is supplied from the PNP transistor T12 to the gate side of the detection transistor Ts; therefore, owing to this constant current, the load actuation circuit can operate like the first embodiment to offer the same effects as those of the first embodiment.

Particularly, in this embodiment, since the circuit (PNP transistor T11 and constant-current source 32) for generating a constant current and the circuit (PNP transistor T12) for making the constant current flow to the gate side of the detection transistor Ts are placed separately in the constant-current circuit 30, in the interior of the constant-current circuit 30, a stable constant current can be generated to be supplied to the gate side of the detection transistor Ts without being affected by the external voltage fluctuation (for example, voltage fluctuation at the output terminal 4).

(Fifth Embodiment)

Figure 7:
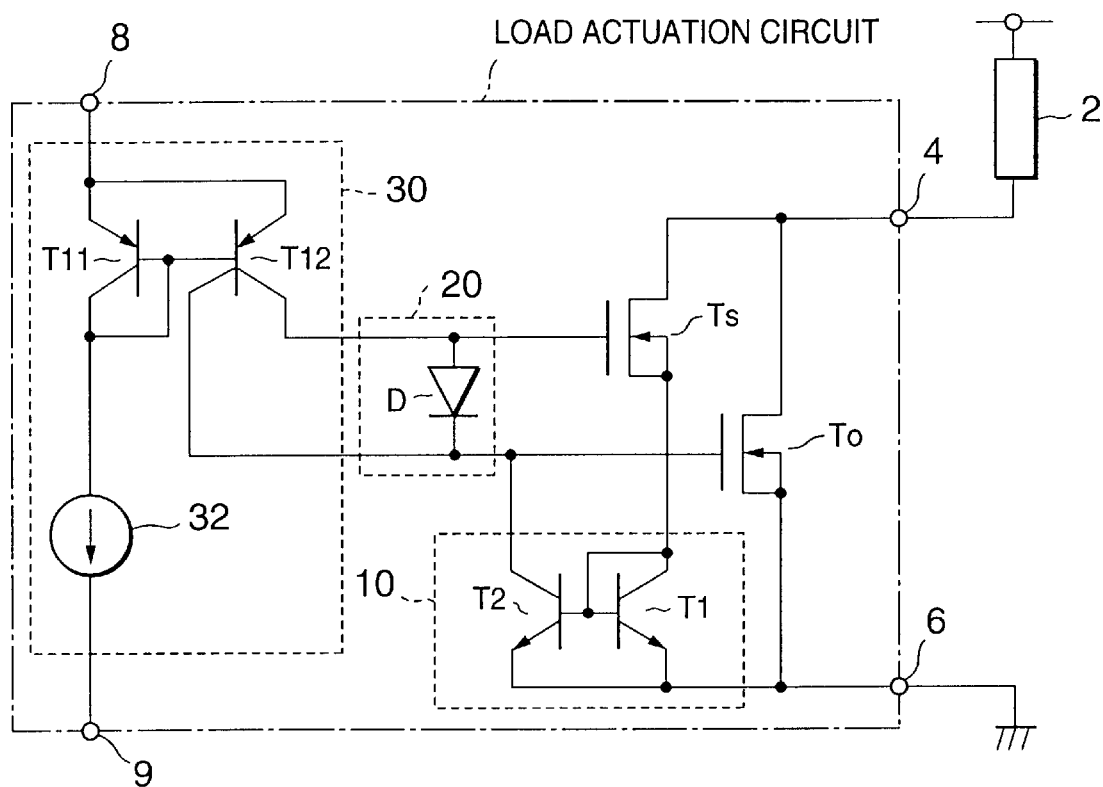
FIG. 7 is an electric circuit diagram showing an arrangement of a load actuation circuit according to a fifth embodiment.

FIG. 7 is an electric circuit diagram showing a configuration of a load actuation circuit according to a fifth embodiment of the invention.

The load actuation circuit according to the fifth embodiment is designed such that, in the load actuation circuit according to the fourth embodiment shown in FIG. 6, the output transistor To can be actuated (turned on) more certainly at a drop of the power-supply voltage to be applied through the power-supply terminals 8 and 9 to the constant-current circuit 30. The difference from the fourth embodiment is that the PNP transistor T12 serving as the fourth transistor constituting the constant-current circuit 30 is made up of a transistor having two collectors, with the two collectors are coupled to the gate of the detection transistor Ts and the gate of the output transistor To, respectively.

That is, in a case in which a constant current is injected from the PNP transistor T12 to only the gate side of the detection transistor Ts like the fourth embodiment, for the operation of the output transistor To, an output voltage of the constant-current circuit 30 is required to be the threshold voltage of the output transistor To plus the forward voltage of a diode D constituting the voltage drop means 20, and if the power-supply voltage to be applied to the constant-current circuit 30 drops to cause the output voltage to become lower than that voltage, difficulty is encountered in actuating the output transistor To irrespective of the operation (turning-on) of the detection transistor Ts.

Accordingly, in this embodiment, a constant current is supplied not only to the gate of the detection transistor Ts but also to the gate of the output transistor To so that the output transistor To can be driven at a lower voltage. This means that, when the power-supply voltage to be fed through the power-supply terminals 8 and 9 drops, this embodiment can prevent the inability of the operation of the output transistor To (namely, the load 2), which enables more stable actuation of the load 2.

In this connection, in a case in which, like this embodiment, a constant current is supplied not only to the gate of the detection transistor Ts but also to the gate of the output transistor To, when the power-supply voltage between the power-supply terminals 8 and 9 is in the normal condition, while the load current increases to approach the current limit value, the constant current fed directly to the gate of the output transistor To is absorbed by the NPN transistor T2 in the current mirror circuit 10 and the constant current introduced through the diode D into the gate side of the output transistor To is absorbed thereafter, which reduces the load current flowing through the output transistor To. Accordingly, also in this embodiment, the current mirror circuit 10 can operate the same as that of each of the above-described embodiments to place a limit on the load current with high precision.

(Sixth Embodiment)

Figure 8:
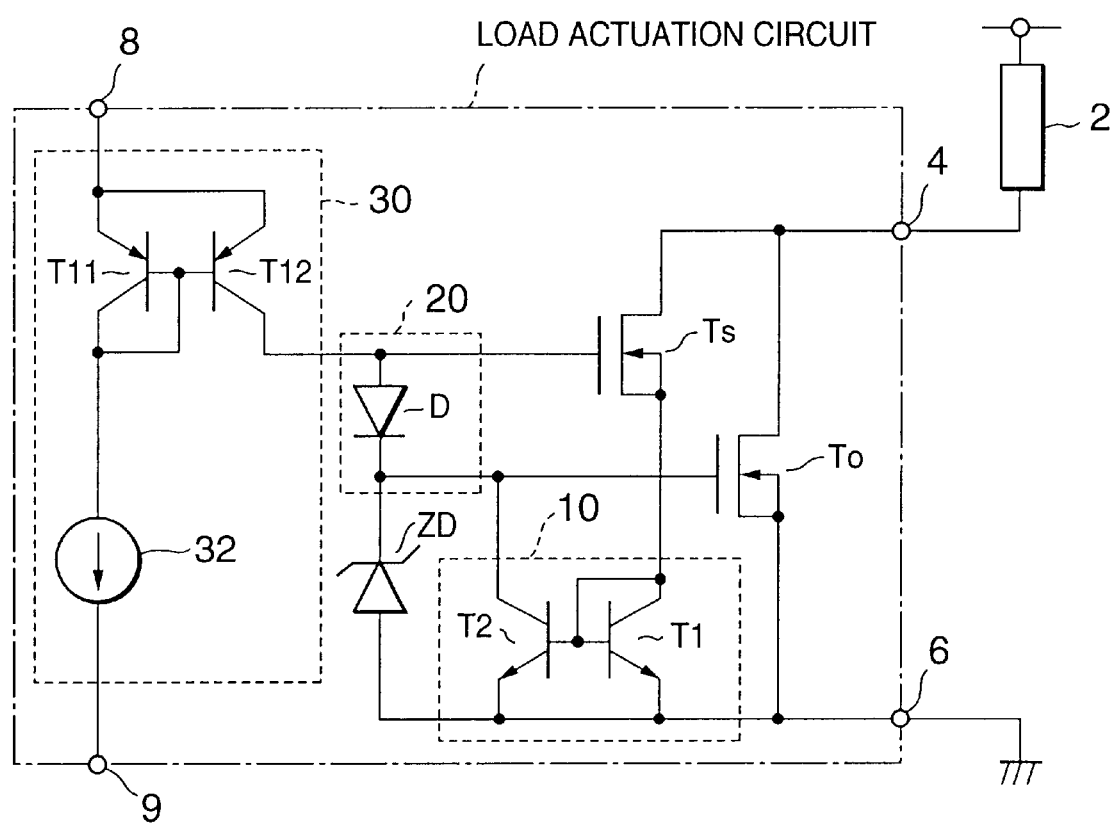
FIG. 8 is an electric circuit diagram showing an arrangement of a load actuation circuit according to a sixth embodiment.

FIG. 8 is an electric circuit diagram showing a configuration of a load actuation circuit according to a sixth embodiment of the invention.

The load actuation circuit according to the sixth embodiment is designed to, in the load actuation circuit according to the fourth embodiment shown in FIG. 6, prevent deterioration or breakdown of the detection transistor Ts and the output transistor To stemming from an output voltage of a constant-current circuit 30 in a case in which a high power-supply voltage is fed through power-supply terminals 8 and 9 to the constant-current circuit 30. The difference from the fourth embodiment is that a Zener diode ZD is put as a clamping means between the gate and source of the output transistor To.

That is, in a case in which the constant-current circuit 30 is constructed like that of the fourth embodiment, the output voltage of the constant-current circuit 30 goes up to the vicinity of the power-supply voltage to be applied through the power-supply terminals 8 and 9. Accordingly, if that power-supply voltage is high, the gate-source voltages of the output transistor To and the detection transistor Ts becomes too high, which can impair or break down these transistors To and Ts.

For this reason, in this embodiment, the anode of the Zener diode ZD is connected to the source of the output transistor while the cathode thereof is connected to the gate of the output transistor To; therefore, the gate-source voltage of the output transistor To is held down to be below the breakdown voltage of the Zener diode to, when the output voltage of the constant-current circuit 30 becomes high, protect the output transistor To (in its turn, the detection transistor Ts) from this voltage.

(Seventh Embodiment)

Figure 9:
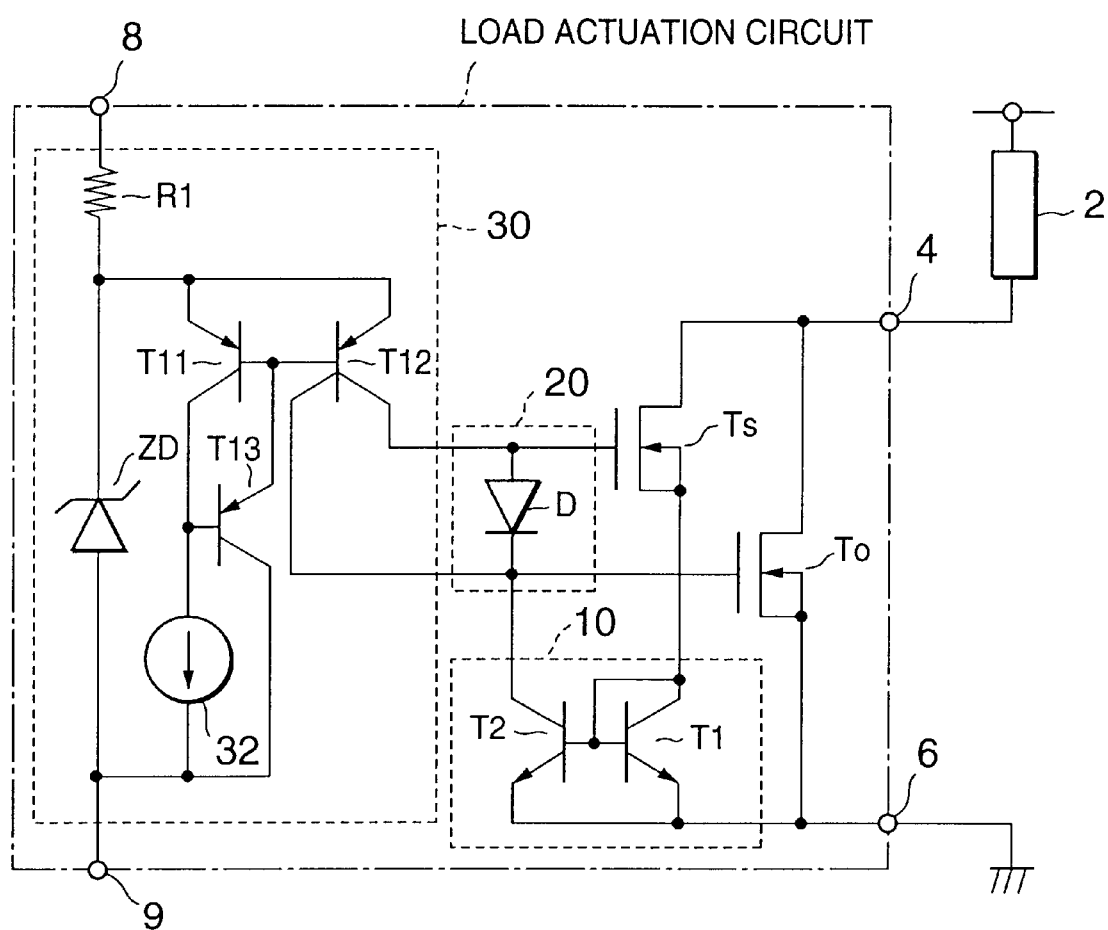
FIG. 9 is an electric circuit diagram showing an arrangement of a load actuation circuit according to a seventh embodiment.

FIG. 9 is an electric circuit diagram showing a configuration of a load actuation circuit according to a seventh embodiment of the invention.

The load actuation circuit according to the seventh embodiment is arranged such that the Zener diode ZD functioning as the clamping means in the above-described sixth embodiment is located in the interior of a constant-current circuit 30 in place of the location between the gate and source of the output transistor To.

This means that the protection of the output transistor To from the output voltage of the constant-current circuit 30 does not always require the direct clamping of the gate-source voltage of the output transistor To, but is also achievable by holding down (clamping) the output voltage itself of the constant-current circuit 30 to under a predetermined voltage.

Accordingly, in this embodiment, a voltage clamping Zener diode ZD is connected in parallel with a series circuit comprising a PNP transistor T11 serving as a third transistor for generating a constant current in the constant-current circuit 30 and a constant-current source 32 so that, even if a power-supply voltage applied from the external through the power-supply terminals 8 and 9 increases, a power-supply voltage below a predetermined voltage is always applied to the series circuit of the PNP transistor T11 and the constant-current source 32 to hold down the output voltage of the constant-current circuit 30 (in its turn, the gate voltages of the output transistor To and the detection transistor Ts) to a voltage under the predetermined voltage.

The load actuation circuit according to this embodiment basically has the same arrangement as that of the load actuation circuit according to the fifth embodiment shown in FIG. 7, but differs in the following two points from the load actuation circuit according to the fifth embodiment.

That is, in this embodiment, in the constant-current circuit 30, a power-supply terminal 8 is connected through a resistor R1 to the emitters of PNP transistors T11 and T12 and the voltage clamping Zener diode ZD is placed between their node and the a power-supply terminal 9 in a state where its node side serves as the cathode while its power-supply terminal 9 side acts as the anode. As a result, a power-supply voltage for generating a constant current in the constant-current circuit 30 is held down to a voltage below a predetermined voltage depending on the breakdown voltage of the Zener diode ZD, and even if the power-supply voltage fed from the external through the power-supply terminals 8 and 9 becomes high, it is possible to prevent the output transistor To and the detection transistor Ts from deteriorating due to the output voltage of the constant-current circuit 30.

In addition, in this embodiment, in the constant-current circuit 30, instead of the direct connection between the base and collector of the PNP transistor T11 constituting a current mirror circuit together with the PNP transistor T12, the emitter of a PNP transistor T13 is connected to the base of the PNP transistor T11 while the base of the PNP transistor T13 is connected to the collector of the PNP transistor T11 to establish the connection between the base-collector of the PNP transistor T11 and the emitter-base of the PNP transistor T13, with the collector of the PNP transistor T13 being wired to the power-supply terminal 9.

This is because, if the base and collector of the PNP transistor T11 is directly connected to each other in the constant-current circuit 30 like the load actuation circuit according to the fifth embodiment, the base currents of the PNP transistors T11 and T12 flow into the constant-current source 32 and the current to be fed from the constant-current circuit 30 to the gates of the detection transistor Ts and the output transistor To shifts from the constant current flowing in the constant-current source 32. That is, in this embodiment, installation of the PNP transistor T13 in the constant-current circuit 30 makes the base currents of the PNP transistors T11 and T12 flow to the PNP transistor T13, thereby controlling the constant current from the constant-current circuit 30 to each of the gates of the transistors Ts and To with higher accuracy.

(Eighth Embodiment)

Figure 10:
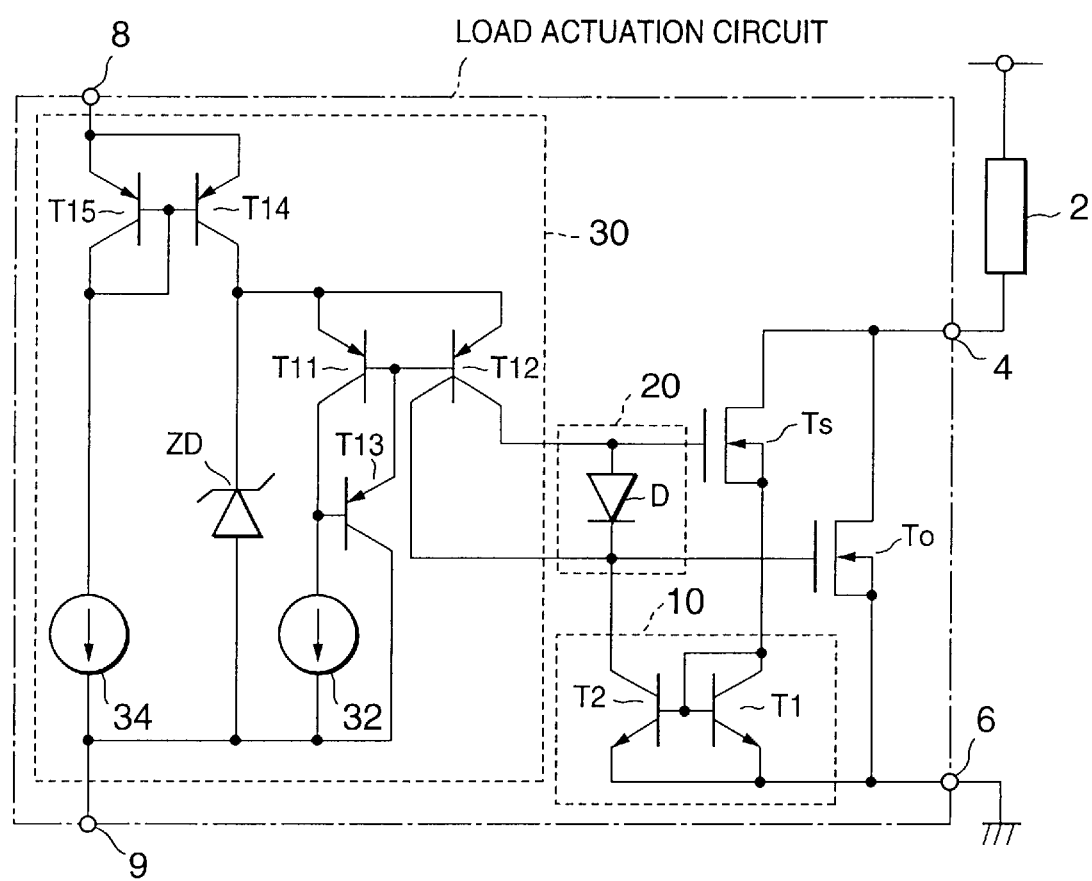
FIG. 10 is an electric circuit diagram showing an arrangement of a load actuation circuit according to an eighth embodiment.

FIG. 10 is an electric circuit diagram showing a configuration of a load actuation circuit according to an eighth embodiment of the invention.

The load actuation circuit according to the eighth embodiment relates to a further improvement of the constant-current circuit 30 in the above-described seventh embodiment and the difference from the seventh embodiment is that, in the constant-current circuit 30, the power-supply terminal 8 and the emitters of the PNP transistors T11 and T12 are connected through a PNP transistor T14 in place of the resistor R1, and there are a PNP transistor T15 constituting a current mirror circuit together with this PNP transistor T14 and a constant-current source 34 for supplying a constant current to the PNP transistor T15.

That is, in the case of the constant-current circuit 30 in the seventh embodiment, the power-supply terminal 8 and the emitters of the PNP transistors T11 and T12 are connected through the resistor R1, which creates a problem that the power consumption in the constant-current circuit 30 increases or the resistor R1 heats, resulting from the electric energy consumed in the resistor R1.

Accordingly, in this embodiment, in place of that resistor R1, is provided the PNP transistor T14 in which its emitter is connected to the power-supply terminal 8 and its collector is connected to the emitters of the PNP transistors T11 and T12. The reduction of the power consumption in the constant-current circuit 30 is achievable in a manner that a current is fed through this PNP transistor T14 to the PNP transistors T11 and T12 sides.

In this connection, the PNP transistor T15 for constituting the current mirror circuit together with the PNP transistor T14 is connected to the PNP transistor T14 at their emitters and bases in a common form, with the base and collector of the PNP transistor T15 being connected directly to each other and the collector thereof being connected through the constant-current source 34 to the power-supply terminal 9.

(Ninth Embodiment)

Figure 11:
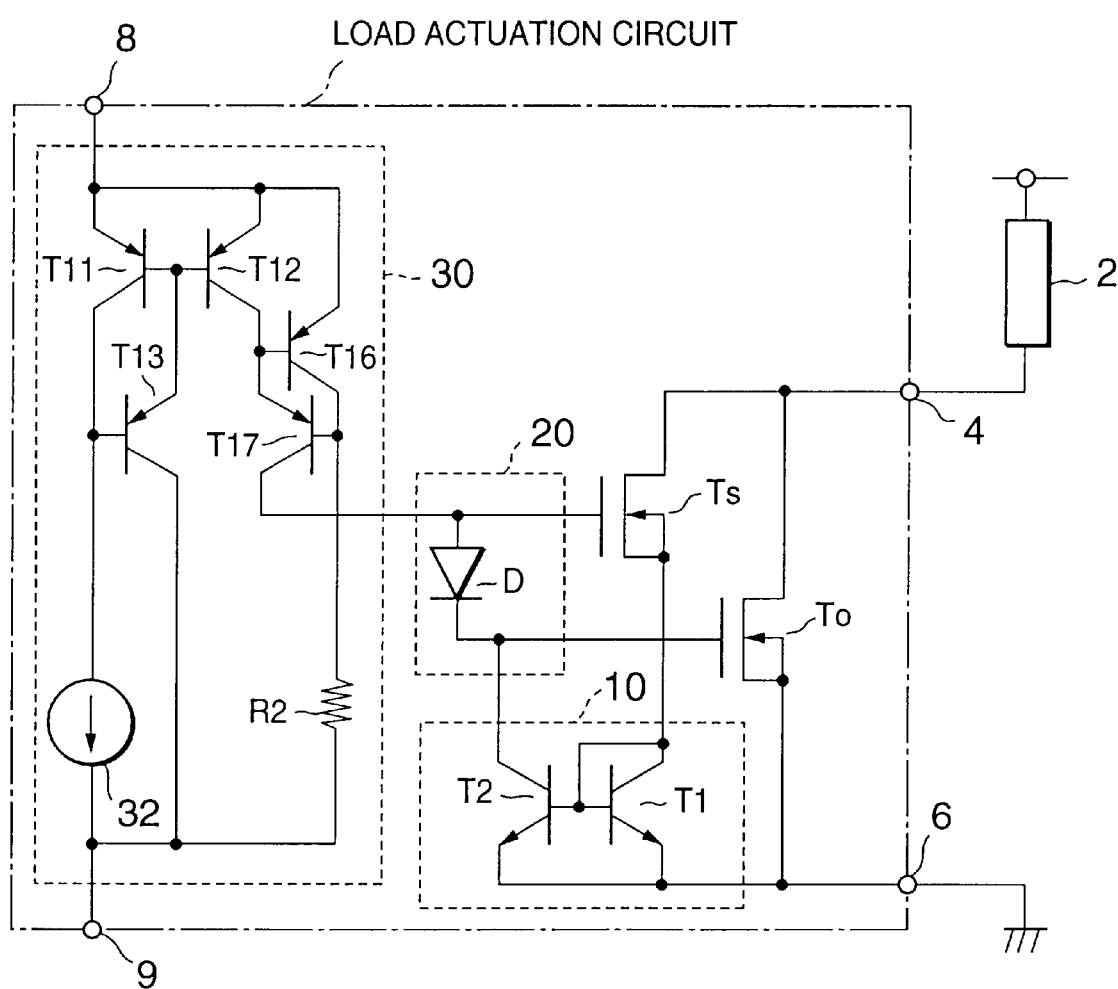
FIG. 11 is an electric circuit diagram showing an arrangement of a load actuation circuit according to a ninth embodiment.

FIG. 11 is an electric circuit diagram showing a configuration of a load actuation circuit according to a ninth embodiment of the invention.

As in the case of the above-described load actuation circuits according to the fourth to eighth embodiments, in the load actuation circuit according to the ninth embodiment, a current mirror circuit comprising PNP transistors T11 and T12 is provided in a constant-current circuit 30 and is designed to cancel the Early effect of the PNP transistor T12 occurring in a case in which a constant current is fed from the one PNP transistor T12 to the gate side of the detection transistor Ts. Basically, this load actuation circuit is similar to the load actuation circuit according to the fourth embodiment shown in FIG. 6.

The difference from the load actuation circuit according to the fourth embodiment is that a PNP transistor T16 forming a fifth transistor and a PNP transistor T17 forming a sixth transistor are provided in the constant-current circuit 30 in order to cancel the Early effect of the PNP transistor T12 and a PNP transistor T13 is provided as with the seventh embodiment shown FIG. 9 in order to prevent the base currents of the PNP transistors T11 and T12 from flowing into the constant-current source 32.

The wiring state and function of the PNP transistor T13 are the same as those in the seventh embodiment, and the description thereof will be omitted for simplicity. Here, a description will be given hereinbelow of the Early effect canceling PNP transistors T16 and T17.

The PNP transistor T16 forming the fifth transistor is arranged such that its emitter is connected to the emitter of the PNP transistor T12, it base is connected to the collector of the PNP transistor T12, and its collector is connected through a resistor R2 to the power-supply terminal 9.

On the other hand, the PNP transistor T17 forming the sixth transistor is arranged such that its emitter is connected to the collector of the PNP transistor T12, its base is connected to the collector of the PNP transistor T16, and its collector is connected to the gate of the detection transistor Ts.

With this arrangement, in the load actuation circuit according to this embodiment, the collector-emitter voltage of the PNP transistor T12 for issuing a constant current is fixed to the base-emitter forward voltage Vf (approximately 0.7V) of the PNP transistor T16, which can cancel the Early effect of the PNP transistor T12.

Thus, with the load actuation circuit according to this embodiment, a constant current proportional to the current flowing through the PNP transistor T11 flows through the PNP transistor T12 to be supplied through the PNP transistor T17 to the gate side of the detection transistor Ts, thereby enabling the load current to be limited to below a predetermined value with high accuracy. The reason therefor has already been described in the "SUMMARY OF THE INVENTION", and a further description thereof will be omitted for brevity.

(Tenth Embodiment)

Figure 12:
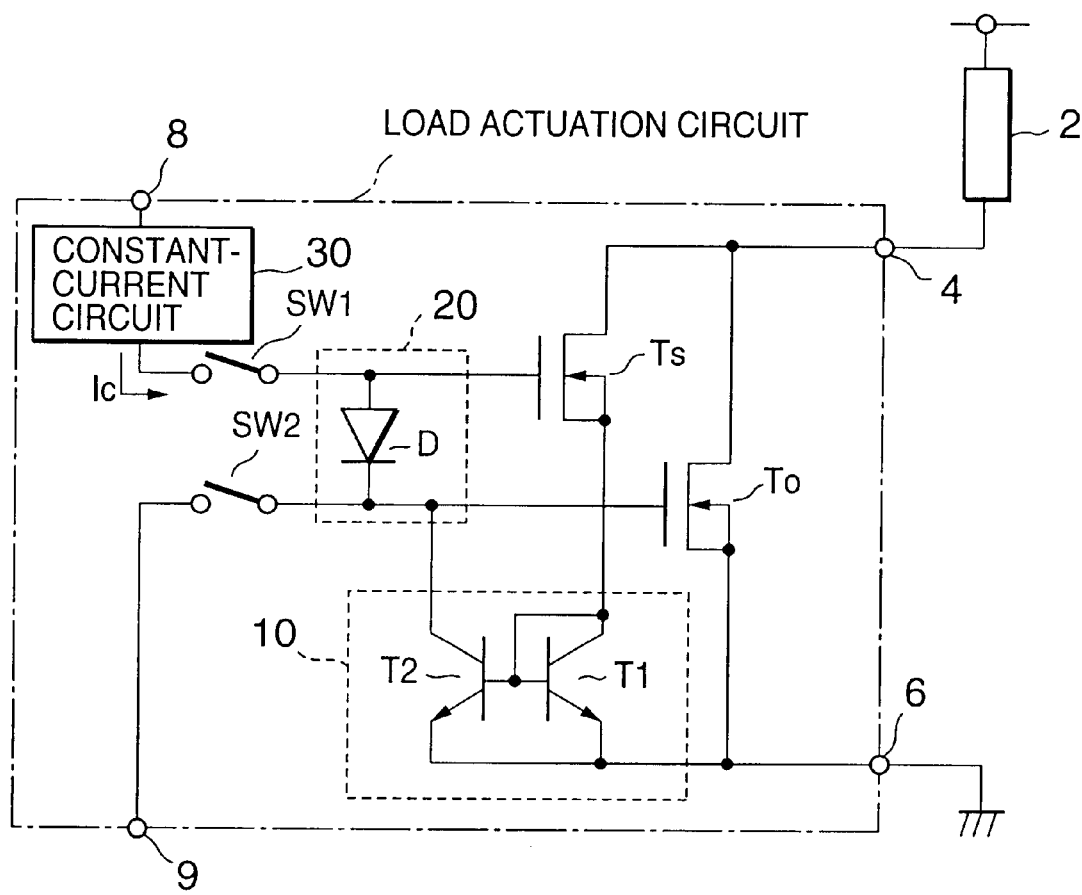
FIG. 12 is an electric circuit diagram showing an arrangement of a load actuation circuit according to a tenth embodiment.

FIG. 12 is an electric circuit diagram showing a configuration of a load actuation circuit according to a tenth embodiment of the invention.

The load actuation circuit according to the tenth embodiment is designed to promptly switch energization/cutoff (interruption) to a load 2 in accordance with a control signal from the external. Concretely, in addition to the arrangement of the load actuation circuit according to the first embodiment shown in FIG. 1, a switching element SW1 is located on a constant-current supply path extending from the constant-current circuit 30 to the gate of the detection transistor Ts, and the gate of the output transistor To and the power-supply terminal 9 are made to be connectable to each other through a switching element SW2. Incidentally, in this embodiment, the power-supply terminal 9 is grounded to be equal in electric potential to the negative side of a load actuation dc power source.

Thus, according to the load actuation circuit according to this embodiment, for the actuation of the load 2, the switching element SW1 is put in the on-position to cause a constant current to be fed from the constant-current circuit 30 to the gate of the detection transistor Ts, while for ceasing the actuation of the load 2, the switching element SW1 is switched into the off-position and the switching element SW2 is set at the on-position.

Furthermore, since the gate of the output transistor To is grounded in setting the switching element SW2 at the on-position for ceasing the actuation of the load 2, the electric charge accumulated in the parasitic capacity of the output transistor To is discharged promptly, which leads to immediate switching-off of the output transistor To.

Accordingly, the load actuation circuit according to this embodiment can cut off the energization to the load 2 at a stop of actuation of the load 2. Incidentally, the switching element SW2 functions as a discharging means in the present invention.

(Eleventh Embodiment)

Figure 13:
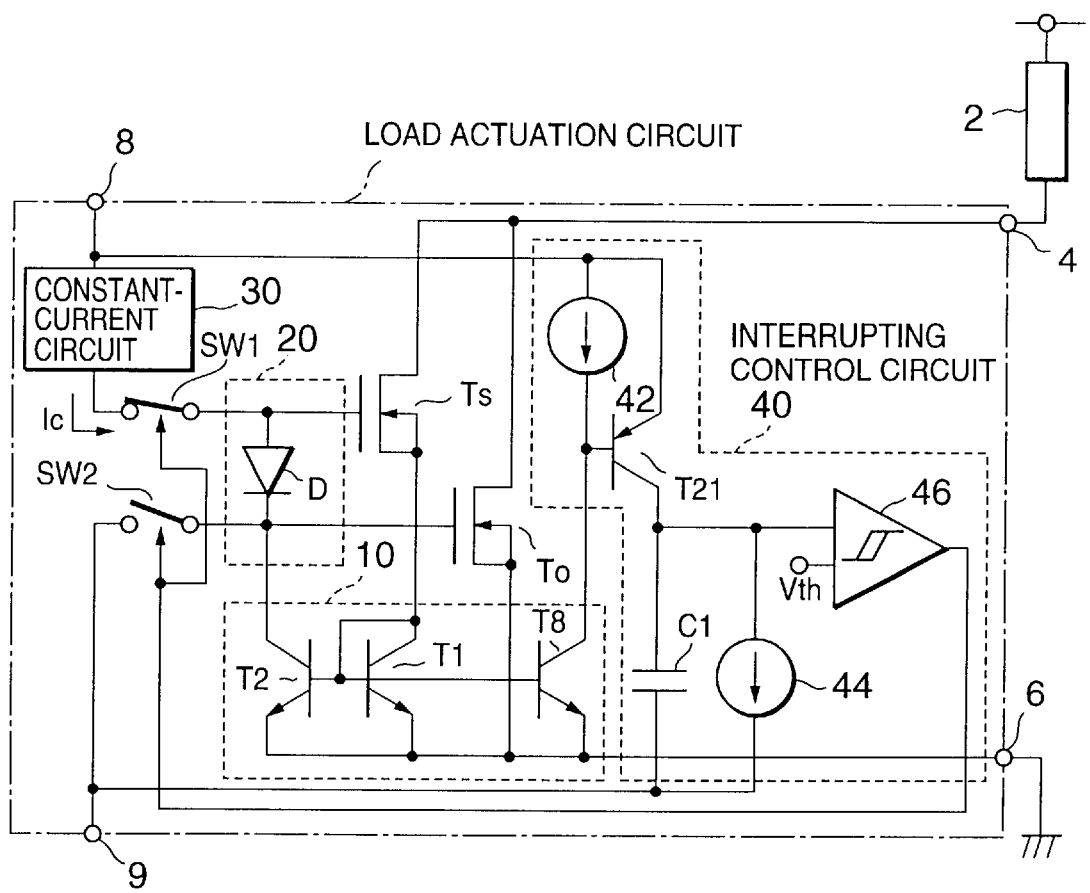
FIG. 13 is an electric circuit diagram showing an arrangement of a load actuation circuit according to an eleventh embodiment.

FIG. 13 is an electric circuit diagram showing a configuration of a load actuation circuit according to an eleventh embodiment of the invention.

The load actuation circuit according to the eleventh embodiment is such that, in addition to the arrangement of the load actuation circuit according to the tenth embodiment shown in FIG. 12, an NPN transistor T8 is provided which acts as a seventh transistor constituting a current mirror circuit 10 in conjunction with the NPN transistors T1 and T2 forming the first and second transistors, respectively, and an interrupting control circuit 40 is provided which makes a decision, on the basis of a current flowing through this NPN transistor T8, as to whether or not the load current reaches an excessive current above a predetermined value, for ceasing or starting the actuation (energization) of the load according to the decision result.

As FIG. 13 shows, in the NPN transistor T8, its base and emitter are connected to the bases and emitters of the NPN transistors T1 and T2 in common forms, respectively, while its collector is connected through a constant-current source 42, provided in the interrupting control circuit 40, to the power-supply terminal 8.

On the other hand, in the interrupting control circuit 40, in addition to the aforesaid constant-current source 42, there are provided a PNP transistor T21 whose base is connected to the node between the constant-current source 42 and the NPN transistor T8, whose emitter is connected to the power-supply terminal 8 and whose collector is connected through a capacitor C1 to the power-supply terminal 9, a constant-current source 44 connected in parallel to the capacitor C1, and a Schmitt trigger 46 which compares a voltage (which will be referred to hereinafter as a "capacitor voltage") at the node between the capacitor C1 and the PNP transistor T21 with a preset reference voltage Vth to, when the capacitor voltage is below the reference voltage Vth, output a control signal (for example, a high-level control signal) for placing the switching element SW1 in the on-condition and for placing the switching element SW2 in the off-condition, and further to, when the capacitor voltage exceeds the reference voltage Vth, output a control signal (for example, a low-level control signal) for putting the switching element SW1 in the off-position and for putting the switching element SW2 in the on-position.

The constant-current source 42 is for injecting a current to the collector side of the NPN transistor T8 when receiving the power supply from the power-supply terminal 8, while another constant-current source 44 is for discharging the electric charge accumulated in the capacitor C1 through the PNP transistor T21.

The Schmitt trigger 46, because its input voltage decision operation is conducted in a hysteresis-formed condition for preventing its output from hunting when its input voltage (in this case, the capacitor voltage) varies in the vicinity of the reference voltage Vth, in fact, when outputting a high-level control signal, makes a decision on whether or not the capacitor voltage assumes a voltage higher by a predetermined value than the reference voltage Vth, and at an output of a low-level control signal, makes a decision on whether or not the capacitor voltage reaches a voltage lower by a predetermined value than the reference voltage Vth.

In the interrupting control circuit 40 thus arranged, in the normal condition showing a normal load current, no current flows through the NPN transistor T8 constituting the current mirror circuit 10, and the base of the PNP transistor T21 shows the power-supply voltage coming in through the power-supply terminal so that the PNP transistor T21 falls into the full off-condition to cause no charging of the capacitor C1.

Furthermore, even if electric charge has been accumulated in the capacitor C1, the electric charge accumulated therein is fully discharged owing to the discharging operation by the constant-current source 44, and the capacitor voltage inputted to the Schmitt trigger 46 becomes 0V (the electric potential of the ground to which the power-supply terminal 9 is connected).

Accordingly, the Schmitt trigger 46 outputs the high-level control signal for placing the switching element SW1 in the on-condition and for putting the switching element SW2 in the off-position, and the constant-current circuit 30 supplies a constant current to the gate of the detection transistor Ts so that a load current is fed through the output transistor To to the load 2.

In this state, if the load current increases and a current proportional to the load current flows through the detection transistor Ts and the NPN transistor T1, a current proportional to the load current is also introduced into the NPN transistor T8. At this time, the current flowing through the NPN transistor T8 comes from the constant-current, source 42.

In addition, if the load current further increases to cause the inability of current supply from the constant-current source 42 to the NPN transistor T8, a forward current flows between the emitter and base of the PNP transistor T21 and the NPN transistor T8 receives currents from both the constant-current source 42 and PNP transistor T21.

Still additionally, when the base current flows through the PNP transistor T21 in this way, a current obtained by multiplying this base current by hFE is fed from the collector of the PNP transistor T21 to the capacitor C1.

Moreover, since the constant-current source 44, discharging the electric charge accumulated, is connected to the capacitor C1, when the collector current of the PNP transistor T21 is smaller than the current issued from the constant-current source 44, no electric charge is put in the capacitor C1.

However, if the load current further increases and the collector current of the PNP transistor T21 increases accordingly to exceed the voltage value the constant-current source 44 is capable of supplying, the capacitor C1 is charged by the collector current fed from the PNP transistor T21.

In this connection, in the interrupting control circuit 40 in this embodiment, the load current flowing when the collector current of the PNP transistor T21 exceeds the current value the constant-current source 44 is capable of issuing and the charging to the capacitor C1 starts is set as an excessive current decision value. Additionally, this excessive current decision value is set at, for example, 5A which is a value lower than a current limit value (for example, 8A) depending on the constant current Ic the constant-current source 30 issues to the gate side of the detection transistor Ts.

Furthermore, when the capacitor voltage reaches a voltage higher by a predetermined value than the reference voltage Vth resulting from the charging to the capacitor C1, the control signal to be outputted from the Schmitt trigger 46 turns from the high-level condition to the low-level condition so that the switching element SW1 falls in the off-condition while the switching element SW2 falls in the on-condition. This turns off the output transistor To promptly to stop the supply of the load current to the load 2.

Still furthermore, since the off-condition of the output transistor To breaks the load current in this way, no current flows through the NPN transistors T1, T2 and T8 to put the PNP transistor T21 in the off-condition. The result is that the electric charge accumulated in the capacitor C1 is discharged through the constant-current source 44.

In addition, when this discharge causes the capacitor voltage to be lower by the predetermined value than the reference voltage Vth, the control signal to be outputted from the Schmitt trigger 46 again assumes the high level, thereby placing the switching element SW1 in the on-condition and putting the switching element SW2 in the off-condition for resuming the current supply to the load 2.

As described above, in the load actuation circuit according to this embodiment, when the load current exceeds the excessive current decision value, the on/off conditions of the switching elements SW1 and SW2 are inverted after the elapse of a predetermined delay time depending on the time to be taken for the charging to the capacitor C1 to turn off the output transistor To for stopping the current supply to the load 2. Furthermore, on the stop of the current supply to the load 2, this time the on/off-conditions of the switching elements SW1 and SW2 are again inverted after the elapse of a predetermined time depending on the time for the discharge from the capacitor C1 to turn on the output transistor To for resuming the current supply to the load 2. Thus, at the flowing of the excessive current through the load 2, the output transistor To is repeatedly turned on and off, thereby reducing the power loss occurring due to the flowing of the excessive current through the output transistor To.

In addition, since the output transistor To is made so as not to be turned off from when the a decision is made to the occurrence of an excessive current (in other words, from when the charging to the capacitor C1 starts) until a predetermined period of time needed for charging the capacitor C1 elapses, it is possible to prevent a rush current flowing through the load 2 at the start-up from being decided as an excessive current in error to turn off the output transistor To in error. Incidentally, in this embodiment, the capacitor C1 to be used for setting such a delay time functions as a delay means in the present invention.

Still additionally, in this embodiment, since a delay time is set between the excessive-current decision and the turning-off of the output transistor To, for example, if the load 2 is broken down because of a short-circuit, although a large load current flows through the output transistor To, the NPN transistor T2 constituting the current mirror circuit 10 draws a current from the gate of the output transistor To so that the load current is limited to below a predetermined value, which avoids the deterioration or breakdown of the output transistor To due to the load current.

(Twelfth Embodiment)

Figure 14:
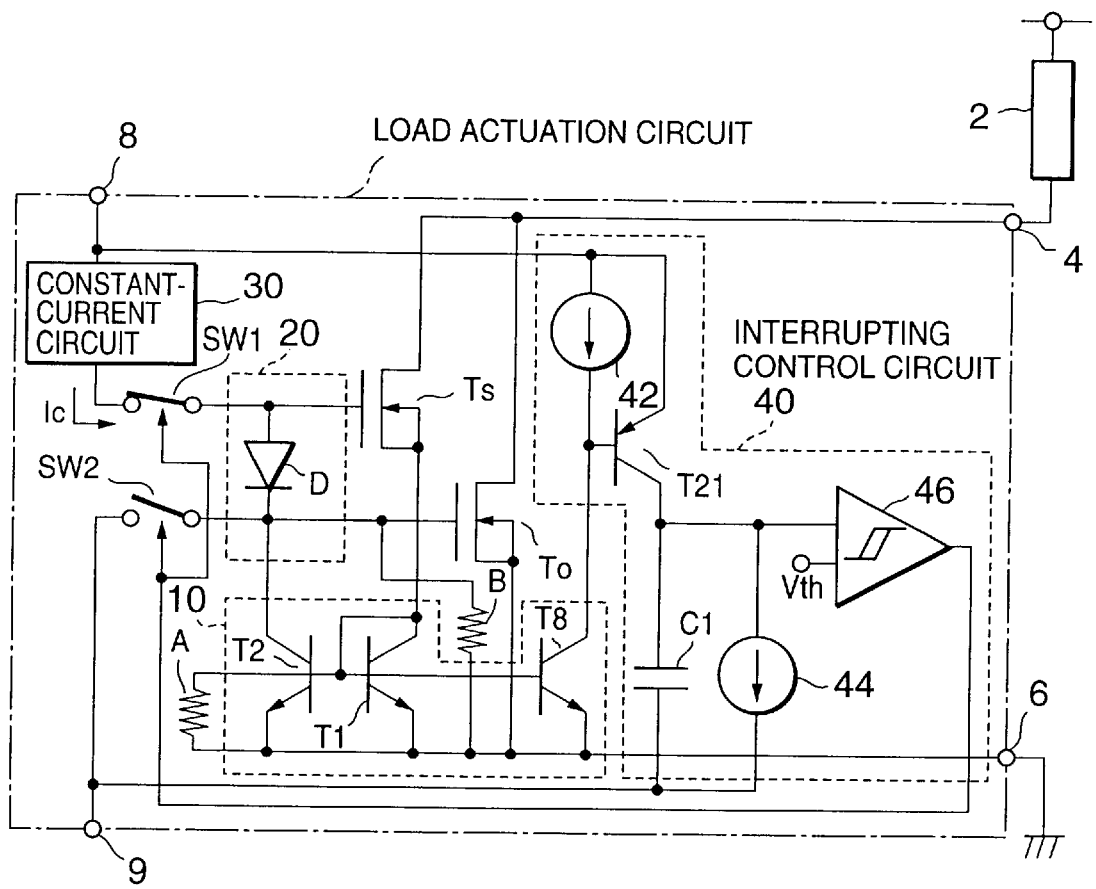
FIG. 14 is an electric circuit diagram showing an arrangement of a load actuation circuit according to a twelfth embodiment.
Figure 15:
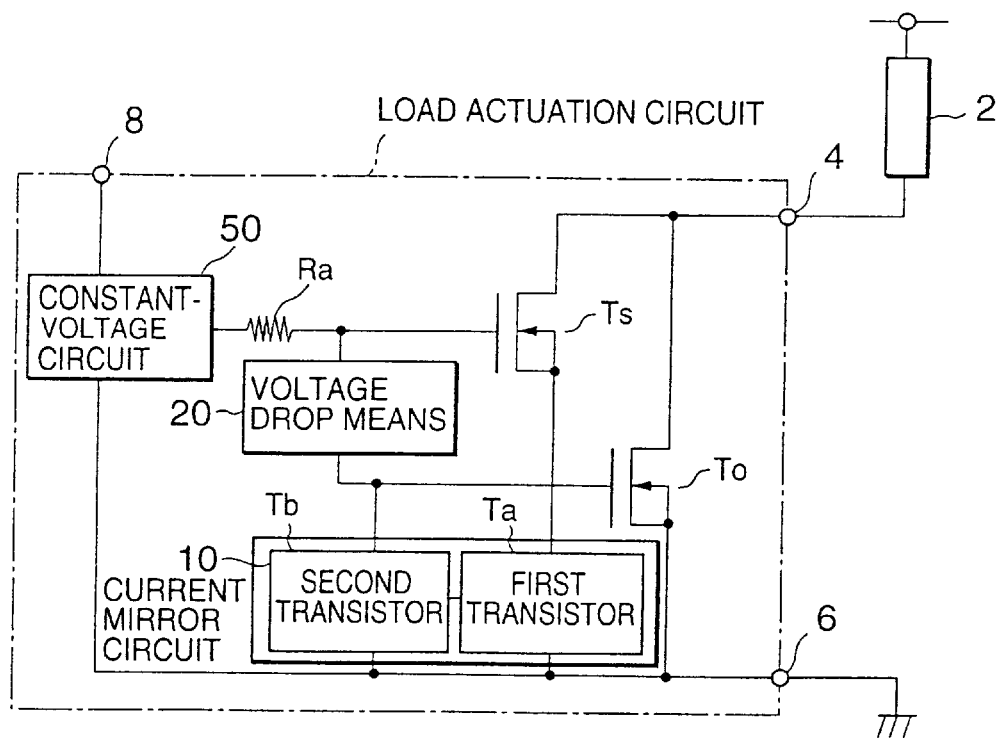
FIG. 15 is an electric circuit diagram showing an arrangement of a load actuation circuit in the related art.
Figure 16:
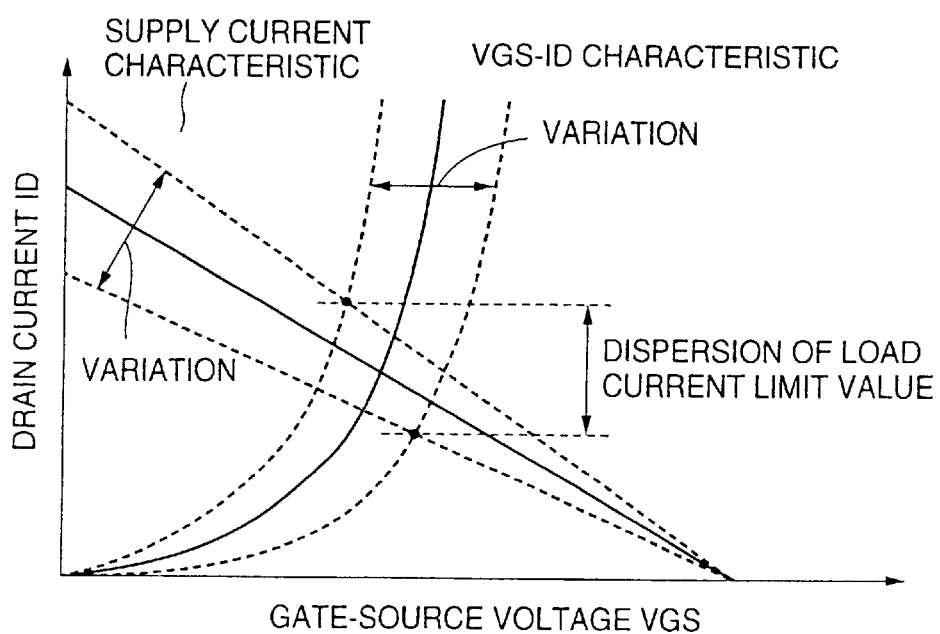
FIG. 16 is an illustration for describing a load current limiting operation of the related art load actuation circuit.

FIG. 14 is an electric circuit diagram showing a configuration of a load actuation circuit according to a twelfth embodiment of the invention.

The load actuation circuit according to the twelfth embodiment is such that, in addition to the load actuation circuit according to the eleventh embodiment shown in FIG. 13, there are provided a resistor A connected between the interconnected control terminals (bases) of the NPN transistors T1, T2 and T8 constituting the current mirror circuit 10 and the negative power-supply line, and a resistor B connected between the control terminal (gate) of the output transistor To and the negative power-supply line (in other words, in parallel to the NPN transistor T2 of the current mirror circuit 10).

The resistor A functions as a bias means, and is for making a flow of a very small current from the bases of the NPN transistors T1, T2 and T8 constituting the current mirror 10 to the negative power-supply line side to maintain the base voltage of each of the transistors T1, T2 and T8 to establish a predetermined electric potential difference with respect to the negative power-supply line even if the electric potential at the negative power-supply line fluctuates.

The resistor B also functions as a bias means, and making a flow of a portion of a current fed through the diode D serving as the voltage drop means 20 to the gate side of the output transistor To to the negative power-supply line side through a current path bypassing the current mirror circuit 10, thereby ensuring that a current flows to the diode D at a drop of the power-supply voltage so that the gate electric potential of the output transistor To is maintained at a constant value corresponding to the gate electric potential of the detection transistor Ts.

Thus, with the load actuation circuit according to the twelfth embodiment, it is possible to prevent the load current limiting operation of the NPN transistor T2 from being conducted incorrectly because the operation of the current mirror circuit 10 becomes unstable, for example, when the electric potential on the negative power-supply line fluctuates with an increase in the load current or the like. In addition, it is possible to prevent the load current limiting operation from being conducted incorrectly when a current does not flow through the diode D at a drop of the power-supply voltage to induce an unstable gate voltage of the output transistor To. As a result, as compared with the load actuation circuit according to the eleventh embodiment, this load actuation circuit according to the twelfth embodiment can place a limit on load current more stably.

Incidentally, the resistors A and B functioning as bias means are not limited to the load actuation circuit according to the eleventh embodiment shown in FIG. 13, but they are also applicable to the above-described load actuation circuits according to the first to tenth embodiments and can display like effects. Additionally, it is also possible to use any one of the resistors A and B. Still additionally, since these resistors A and B are for accomplishing a flow of a very small current to stabilize the base electric potential of the NPN transistor T2 or the gate electric potential of the output transistor To, it is also appropriate to use a constant-current circuit in place of each of the resistors A and B.

Although the various embodiments to which the present invention is applied have been described above, it should be understood that the present invention is not limited to the above-described embodiments, and that it is intended to cover all changes and modifications of the embodiments of the invention herein which do not constitute departures from the spirit and scope of the invention.

For example, in the above description of the embodiments, although a MOS transistor has been employed as each of the output transistor To and the detection transistor Ts, each of these transistors To and Ts can also be changed to a bipolar transistor. Concretely, for example, if a load actuation circuit is of a low-side type shown in FIG. 3, the output transistor To and the detection transistor Ts can also be made with an NPN bipolar transistor in place of the N-channel MOS transistor. Furthermore, if a load actuation circuit is of a high-side type shown in FIG. 4, the output transistor To and the detection transistor Ts can also be made with a PNP bipolar transistor in place of the P-channel MOS transistor.

In addition, in the above description, although each of the fourth to twelfth embodiments relates to an example of a low-side type load actuation circuit involving the load actuation circuit according to the first embodiment shown in FIG. 3 as a basic circuit, the constant-current circuit 30, the voltage clamping circuit, the power supply interrupting control circuit 40 and other circuits, described in the fourth to twelfth embodiments, are also applicable to the load actuation circuits other than the first embodiment, such as high-side load actuation circuits.

What is claimed is:

1. A load actuation circuit comprising:
an output MOS transistor for supplying a load current to a load, said output transistor being of a voltaic-controlled type;
a detection transistor having a control terminal connected electrically to a control terminal of said output transistor, for producing a flow of a current proportional to said load current flowing through said output transistor;
load current limiting means for limiting said load current, flowing through said output transistor, to a predetermined value on the basis of a current flowing through said detection transistor; and
a constant-current circuit for supplying a constant current as a control signal for actuation of said load to said control terminal of said detection transistor.

2. A load actuation circuit comprising:
an output transistor for supplying a load current to a load, said output transistor being of a voltage-controlled type;
a detection transistor for detecting said load current flowing through said output transistor;
a first transistor connected in series to said detection transistor and, together with said detection transistor, connected in parallel to said output transistor so that a current proportional to said load current flows through said output transistor; and
a second transistor for constituting a current mirror circuit in connection with said first transistor,
wherein control terminals of said output transistor and said detection transistor are connected electrically to each other so that said output transistor and said detection transistor are driven about the same time in response to a control signal for actuation of said load, and a voltage level at said control terminal of said output transistor is changed by a current flowing through said second transistor to limit said load current to a predetermined value,
in the configuration, said circuit further comprising:
voltage drop means provided between said control terminals of said output transistor and said detection transistors for producing a voltage drop, equal substantially to a voltage drop developing in said first transistor when a current proportional to said load current flows through said detection transistor, to establish a general correspondence in operating point between said output transistor and said detection transistor; and
a constant-current circuit for supplying a constant current as said control signal to said control terminal of said detection transistor.

3. A load actuation circuit according to claim 2, wherein said output transistor and said detection transistor are formed with MOS transistors whose drains are connected to each other and whose gates forming said control terminals are connected to each other in a state where said voltage drop means is interposed therebetween.

4. A load actuation circuit according to claim 3, wherein said MOS transistor forming each of said output transistor and said detection transistor is of an N-channel type, and said constant-current circuit feeds said constant current into the gate side of said detection transistor forming said control terminal thereof, while said second transistor takes in said constant current fed from said constant-current circuit through said voltage drop means to said gate of said output transistor forming said control terminal thereof.

5. A load actuation circuit according to claim 3, further comprising discharge means for, when said output transistor is turned off by breaking the supply of said constant current from said constant-current circuit, performing discharge from said gate of said output transistor.

6. A load actuation circuit according to claim 2, wherein said first transistor and said second transistor are formed with bipolar transistors whose bases are connected in a common form and whose emitters are connected in a common form, and a collector of said bipolar transistor forming said first transistor is connected to said detection transistor and further to said bases connected in the common form, while a collector of said bipolar transistor forming said second transistor is connected to said control terminal of said output transistor.

7. A load actuation circuit according to claim 6, wherein said voltage drop means is a semiconductor element made to generate a forward voltage by a PN junction.

8. A load actuation circuit according to claim 2, wherein said first transistor and said second transistor are formed with MOS transistors whose gates are connected in a common form and whose sources are connected in a common form, and a drain of said MOS transistor forming said first transistor is connected to said detection transistor and further to said gates connected in the common form, while a drain of said MOS transistor forming said second transistor is connected to said control terminal of said output transistor.

9. A load actuation circuit according to claim 8, wherein said voltage drop means is made with a MOS transistor designed to produce a voltage drop by a gate-source voltage thereof.

10. A load actuation circuit according to claim 2, wherein said constant-current circuit includes a third transistor and a fourth transistor for constituting a current mirror circuit and a constant-current source, together with said third transistor, connected between positive and negative poser-supply lines for making a constant current flow through said third transistor, with said fourth transistor being connected to said control terminal of said detection transistor to supply a constant current, proportional to the current flowing through said third transistor, through said fourth transistor to said control terminal of said detection transistor.

11. A load actuation circuit according to claim 10, wherein said third transistor and said fourth transistor are formed with bipolar transistors whose bases are connected in a common form and whose emitters are connected in a common form, and a collector of said bipolar transistor forming said third transistor is connected to said constant-current source and further to said bases connected in the common form, while a collector of said bipolar transistor forming said fourth transistor is connected to said control terminal of said detection transistor.

12. A load actuation circuit according to claim 11, wherein said constant-current circuit includes a fifth transistor formed with a bipolar transistor identical to said fourth transistor, with a base of said fifth transistor being connected to said collector of said fourth transistor, said emitter thereof being connected to said emitter of said fourth transistor and a collector thereof being connected to the power-supply line to said constant-current source on the opposite side to said third transistor, and further includes a sixth transistor formed with a bipolar transistor identical to said fourth transistor, with an emitter of said sixth transistor being connected to said collector of said fourth transistor, a base thereof being connected to said collector of said fifth transistor, and a collector thereof being connected to said base of said detection transistor, and a constant current proportional to a current to be fed through said sixth transistor to said third transistor is supplied to said control terminal of said detection transistor for preventing current variation from occurring due to the Early effect of said fourth transistor.

13. A load actuation circuit according to claim 11, wherein, in said constant-current circuit, said bipolar transistor whose collector is connected to said control terminal of said detection transistor has a second collector connected to said control terminal of said output transistor, with a constant current being further supplied directly through said second collector to said control terminal of said output transistor.

14. A load actuation circuit according to claim 2, further comprising clamping means for holding down a voltage at said control terminal of said output transistor to a voltage below a predetermined value.

15. A load actuation circuit according to claim 2, further comprising:
   a seventh transistor for constituting a current mirror circuit together with said first transistor and said second transistor; and
   an interrupting control circuit for turning off said output transistor and said detection transistor when detecting, on the basis of a current flowing through said seventh transistor, that said load current reaches an excessive current above a predetermined value, and further for turning on said output transistor and said detection transistor when afterwards detecting that said load current becomes free from said excessive current.

16. A load actuation circuit according to claim 15, wherein said interrupting control circuit includes delay means for turning off said output transistor and said detection transistor after the elapse of a predetermined period of time from the detection of said excessive current.

17. A load actuation circuit according to claim 2, further comprising a bias means provided between said control terminal of said output transistor and an output terminal thereof for forming a current path bypassing said second transistor to stabilize an operation of said output transistor.

18. A load actuation circuit according to claim 2, further comprising a bias means provided between a control terminal of said second transistor and a power-supply line connected to an output terminal of said second transistor for forming a current path to stabilize an operation of said second transistor.

19. A load actuation circuit according to claim 2, further comprising:

a first switching element located on a constant-circuit supply path extending from said constant-current circuit to a control terminal of said detection transistor;
a second switching element between a first power supply terminal and said control terminal of said output transistor;
wherein for actuation of a load, said first switching element is switched on to cause said constant current to be fed from said constant-current circuit to said control terminal of said detection transistor;
wherein for ceasing actuation of said load, said first switching element is switched off and said second switching element is switched on; and
wherein said second switching element functions as a discharging means.

20. A load actuation circuit according to claim 19, further comprising:
an NPN transistor comprising said current mirror circuit in conjunction with said first and second transistors;
wherein a base of said NPN transistor is connected to bases of said first and second transistors; and
wherein an emitter of said NPN transistor is connected to emitters of said first and second transistors.

21. A load actuation circuit according to claim 20, further comprising:
an interrupting control circuit that controls said first and second switching elements;
said interrupting control circuit comprised of a constant current source connected to a second power supply terminal;
said interrupting control circuit further comprised of a PNP transistor, wherein a base of said PNP transistor is in contact with said constant current source and a collector of said NPN transistor;
wherein an emitter of said PNP transistor is connected to said second power supply terminal; and
wherein a collector of said PNP transistor is connected through a capacitor to said first power supply terminal.

22. A load actuation circuit according to claim 21, wherein said interrupting control circuit further comprises:
a second constant current source connected in parallel to said capacitor;
a Schmitt trigger that compares a circuit output voltage with a preset reference voltage; and
wherein said Schmitt trigger outputs a control signal to said first and second switching elements based on said comparison between said circuit output voltage and said reference voltage.

* * * * *